(12) United States Patent
Lee et al.

(10) Patent No.: US 9,099,470 B2
(45) Date of Patent: Aug. 4, 2015

(54) METHOD OF FORMING PATTERNS FOR SEMICONDUCTOR DEVICE

(71) Applicant: Samsung Electronics Co., Ltd., Suwon-si (KR)

(72) Inventors: Young-Ho Lee, Hwaseong-si (KR); Jae-Hwang Sim, Seoul (KR); Sang-Yong Park, Suwon-si (KR); Kyung-Lyul Moon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/208,456

(22) Filed: Mar. 13, 2014

(65) Prior Publication Data

US 2014/0191405 A1 Jul. 10, 2014

Related U.S. Application Data

(63) Continuation of application No. 13/678,930, filed on Nov. 16, 2012, now Pat. No. 8,697,580, which is a continuation of application No. 12/653,588, filed on Dec. 16, 2009, now Pat. No. 8,318,603.

(30) Foreign Application Priority Data

Feb. 27, 2009 (KR) .................. 10-2009-0017156

(51) Int. Cl.
*H01L 21/033* (2006.01)
*H01L 23/528* (2006.01)
(Continued)

(52) U.S. Cl.
CPC .......... *H01L 23/528* (2013.01); *H01L 21/0337* (2013.01); *H01L 21/0338* (2013.01);
(Continued)

(58) Field of Classification Search
None
See application file for complete search history.

(56) References Cited

U.S. PATENT DOCUMENTS

| 7,037,850 B2 | 5/2006 | Lee et al. |
| 7,253,118 B2 | 8/2007 | Tran et al. |

(Continued)

FOREIGN PATENT DOCUMENTS

| JP | 2005-181758 | 7/2005 |
| KR | 10-2006-0110706 | 10/2006 |
| KR | 10-2008-0034234 | 4/2008 |

OTHER PUBLICATIONS

"Method of Forming Patterns for Semiconductor Device" Specification, Drawings, Claims and Prosecution History, of U.S. Appl. No. 12/653,588, filed Dec. 16, 2009, by Young-Ho Lee, et al.

(Continued)

*Primary Examiner* — Duy Deo
(74) *Attorney, Agent, or Firm* — Onello & Mello, LLP.

(57) ABSTRACT

Provided is a method of forming patterns for a semiconductor device in which fine patterns and large-width patterns are formed simultaneously and adjacent to each other. In the method, a first layer is formed on a substrate so as to cover a first region and a second region which are included in the substrate. Both a blocking pattern covering a portion of the first layer in the first region and a low-density large-width pattern covering a portion of the first layer in the second region are simultaneously formed. A plurality of sacrificial mask patterns are formed on the first layer and the blocking pattern in the first region. A plurality of spacers covering exposed sidewalls of the plurality of sacrificial mask patterns are formed. The plurality of sacrificial mask patterns are removed. The first layer in the first and second regions are simultaneously etched by using the plurality of spacers and the blocking pattern as etch masks in the first region and using the low-density large-width pattern as an etch mask in the second region.

19 Claims, 30 Drawing Sheets

(51) Int. Cl.
  *H01L 21/308* (2006.01)
  *H01L 21/311* (2006.01)
  *H01L 21/762* (2006.01)
  *H01L 27/115* (2006.01)
  *H01L 21/768* (2006.01)
  *H01L 27/108* (2006.01)

(52) U.S. Cl.
  CPC ........ *H01L21/3086* (2013.01); *H01L 21/3088* (2013.01); *H01L 21/31144* (2013.01); *H01L 21/76229* (2013.01); *H01L 21/76816* (2013.01); *H01L 27/11519* (2013.01); *H01L 27/11526* (2013.01); *H01L 21/76838* (2013.01); *H01L 27/10814* (2013.01); *H01L 27/10855* (2013.01)

(56) References Cited

U.S. PATENT DOCUMENTS

| | | | |
|---|---|---|---|
| 7,393,789 B2 | 7/2008 | Abatchev et al. | |
| 7,488,685 B2 | 2/2009 | Kewley | |
| 7,737,041 B2 | 6/2010 | Kito et al. | |
| 2006/0209585 A1* | 9/2006 | Tanizaki et al. | 365/148 |
| 2006/0240361 A1 | 10/2006 | Lee et al. | |

OTHER PUBLICATIONS

"Method of Forming Patterns for Semiconductor Device" Specification, Drawings, Claims and Prosecution History, of U.S. Appl. No. 13/678,930, filed Nov. 16, 2012, by Young-Ho Lee, et al.

\* cited by examiner

METHOD OF FORMING PATTERNS FOR SEMICONDUCTOR DEVICE

CROSS-REFERENCE TO RELATED APPLICATIONS

This application is a continuation application of U.S. patent application Ser. No. 13/678,930, filed on Nov. 16, 2012, which is a continuation application of U.S. patent application Ser. No. 12/653,588, filed on Dec. 16, 2009, which claims the benefit under 35 U.S.C. 119 of Korean Patent Application No. 10-2009-0017156, filed on Feb. 27, 2009, in the Korean Intellectual Property Office, the entire contents of which are incorporated herein by reference.

BACKGROUND

The inventive concept relates to a method of forming patterns for a semiconductor device, and more particularly, to a method of forming patterns for a semiconductor device in which a plurality of patterns having various widths are simultaneously formed while using a double patterning process.

In manufacturing high-scaled highly-integrated semiconductor devices, to form both fine patterns having fine widths, which are repeatedly formed at fine pitches, and patterns having relatively large widths at adjacent locations simultaneously, a technique for securing a sufficient alignment margin between the fine patterns and the large-width patterns so as to allow desired patterns to be formed according to a design without producing faulty patterns is required.

SUMMARY

The inventive concept provides a method of forming patterns for a semiconductor device in which both fine patterns that overcome a resolution limit caused by a photolithographic process by using patterns having different widths and large-width patterns having relatively large sizes are formed simultaneously to be adjacent to each other, so that desired patterns can be formed without producing defective patterns according to a design by securing a sufficient alignment margin between the fine patterns and the large-width patterns.

According to an aspect of the inventive concept, there is provided a method of forming patterns for a semiconductor device. In the method, a first layer is formed on a substrate so as to cover a first region and a second region which are included in the substrate. Both a blocking pattern covering a portion of the first layer in the first region and a low-density large-width pattern covering a portion of the first layer in the second region are simultaneously formed. A plurality of sacrificial mask patterns are formed on the first layer and the blocking pattern in the first region. A plurality of spacers covering exposed sidewalls of the plurality of sacrificial mask patterns are formed. The plurality of sacrificial mask patterns are removed. The first layer in the first and second regions are simultaneously etched by using the plurality of spacers and the blocking pattern as etch masks in the first region and using the low-density large-width pattern as an etch mask in the second region.

The first layer and the plurality of spacers may be formed of the same material.

One of the plurality of sacrificial mask patterns may be formed on the blocking pattern. The plurality of sacrificial mask patterns may extend parallel to each other in a first direction, and a width of the blocking pattern in a second direction perpendicular to the first direction may be equal to or greater than a width of the sacrificial mask pattern formed on the blocking pattern.

Two adjacent sacrificial mask patterns may be formed on the blocking pattern. The plurality of sacrificial mask patterns may extend parallel to each other in a first direction, and a width of the blocking pattern in a second direction perpendicular to the first direction may be equal to or greater than a distance between the two adjacent sacrificial mask patterns. Portions of the first layer may be exposed through spaces between the plurality of sacrificial mask patterns, and other portions of the first layer may not be exposed due to being covered by the blocking pattern in the entire area along the second direction in a part of a space between the two adjacent sacrificial mask patterns.

Each of the plurality of sacrificial mask patterns may include a plurality of first patterns extending parallel to each other in a first direction; and a second pattern extending in a second direction perpendicular to the first direction in between the two adjacent sacrificial mask patterns such as to be connected to the two adjacent sacrificial mask patterns on the blocking pattern.

The blocking pattern and the low-density large-width pattern may be formed of the same material.

The forming of the plurality of sacrificial mask patterns and the forming of the plurality of spacers may be performed in a state where the first layer and the low-density large-width pattern are covered with a second layer in the second region. In the removing of the plurality of sacrificial mask patterns, the second layer may be removed at the same time as when the plurality of sacrificial mask patterns are removed.

In a method of forming patterns for a semiconductor device according to the inventive concept, large-widths patterns having relatively large sizes are first formed, and then fine patterns that overcome a resolution limit caused by a photolithographic process are formed using a double patterning process. A plurality of patterns having different widths are simultaneously obtained on the substrate by using the large-widths patterns and the fine patterns as an etch mask at the same time. Accordingly, desired patterns can be formed without producing defective patterns according to a design by forming the large-widths patterns and the fine patterns according to a process capable of securing a sufficient alignment margin between the fine patterns and the large-width patterns when the large-widths patterns and the fine patterns are simultaneously formed to be adjacent to each other. Moreover, various patterns having different widths and different pattern densities can be easily formed according to a simple process.

BRIEF DESCRIPTION OF THE DRAWINGS

The foregoing and other features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIG. 3A through FIG. 10C are views illustrating a method of forming patterns for a semiconductor device, according to an embodiment of the inventive concept, wherein FIGS. 3A, 4A, 5A, 6A, 7A, 8A, 9A and 10A are plan views illustrating a region of the semiconductor device of FIG. 2; FIGS. 3C, 4C, 5C, 6C, 7C, 8C, 9C and 10C contain cross-sectional views taken along a plane Y1-Y1' of FIGS. 3A, 4A, 5A, 6A, 7A, 8A, 9A and 10A, respectively.

FIG. 11A through FIG. 18B are views illustrating a method of forming patterns for a semiconductor device, according to another embodiment of the inventive concept, wherein FIGS. 11A, 12A, 13A, 14A, 15A, 16A, 17A and 18A are plan views illustrating a method of forming patterns for a semiconductor device; and FIGS. 11B, 12B, 13B, 14B, 15B, 16B, 17B and 18B contain cross-sectional views taken along planes X11A-X11A' and X11B-X11B' of FIGS. 11A, 12A, 13A, 14A, 15A, 16A, 17A and 18A, respectively.

DETAILED DESCRIPTION OF THE EMBODIMENTS

Figure 1:
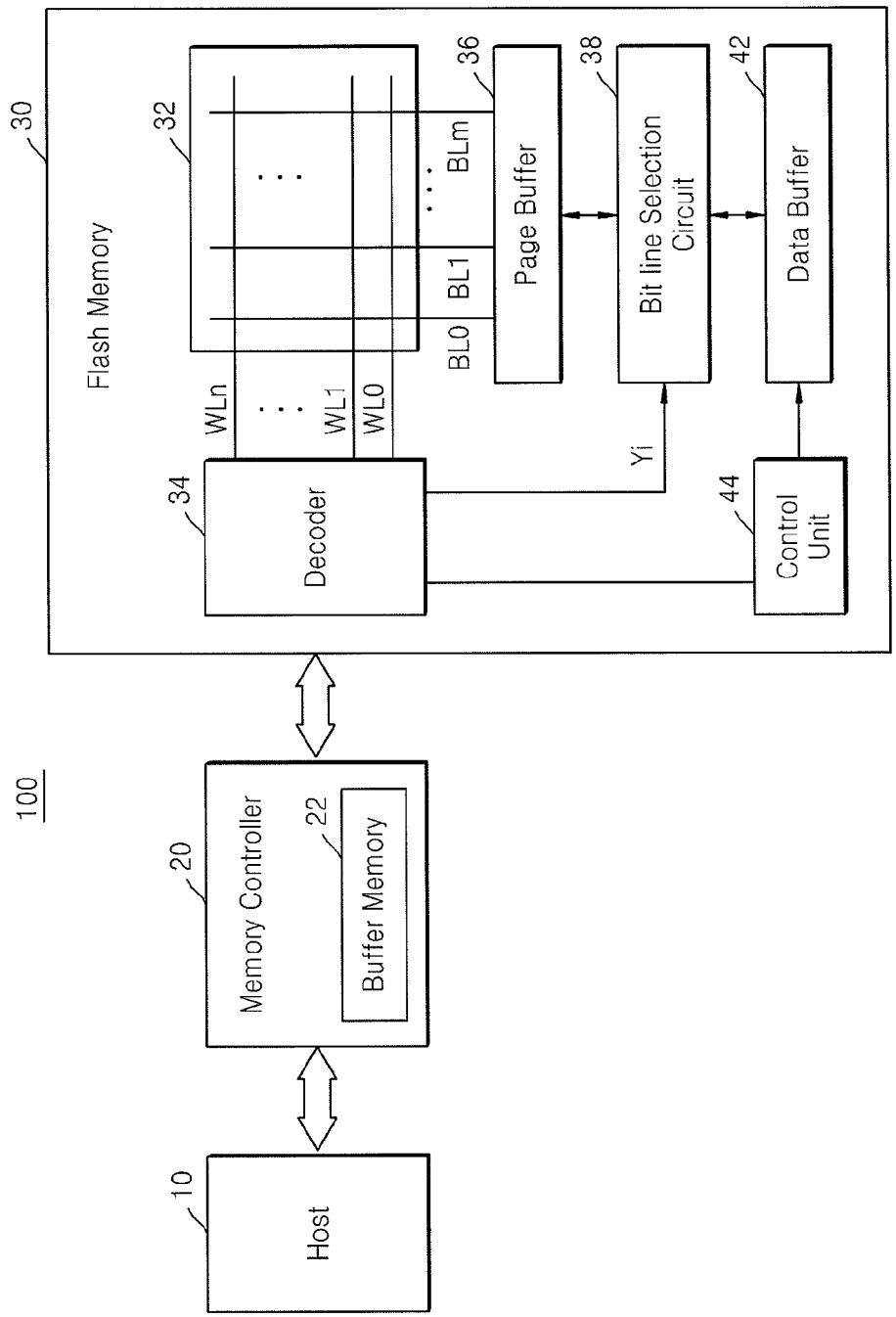
FIG. 1 is a block diagram schematically illustrating a memory system of a semiconductor device that can be manufactured using a pattern forming method according to the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this description will be thorough and complete, and will fully convey the inventive concept to those of ordinary skill in the art. In the drawings, the thicknesses and widths of layers and regions are exaggerated for clarity. Like reference numerals in the drawings denote like elements. The elements and regions illustrated in the figures are schematic in nature, and thus relative sizes or intervals illustrated in the figures are not intended to limit the scope of the inventive concept.

FIG. 1 is a block diagram schematically illustrating a memory system 100 of a semiconductor device that can be manufactured using a pattern forming method according to the inventive concept. Referring to FIG. 1, the memory system 100 includes a host 10, a memory controller 20, and a flash memory 30.

The memory controller 20 serves as an interface between the host 10 and the flash memory 30, and includes a buffer memory 22. Although not shown in FIG. 1, the memory controller 20 may further include a central processing unit (CPU), a read only memory (ROM), a random access memory (RAM), and interface blocks.

The flash memory 30 may include a cell array 32, a decoder 34, a page buffer 36, a bit line selection circuit 38, a data buffer 42, and a control unit 44.

The host 10 inputs data and a write command to the memory controller 20. The memory controller 20 controls the flash memory 30 such that the input data is written to the cell array 32 according to the received write command. The memory controller 20 also controls the flash memory 30 to read out the data stored in the cell array 32 according to a read command received from the host 10. The buffer memory 22 temporarily stores data transmitted between the host 10 and the flash memory 30.

The cell array 32 of the flash memory 30 includes a plurality of memory cells. The decoder 34 is connected to the cell array 32 via word lines WL0 through WLn. The decoder 34 receives an address from the memory controller 20 and selects one of the word lines WL0 through WLn or generates a selection signal Yi for selecting bit lines BL0 through BLm. The page buffer 36 is connected to the cell array 32 via the bit lines BL0 through BLm.

Figure 2:
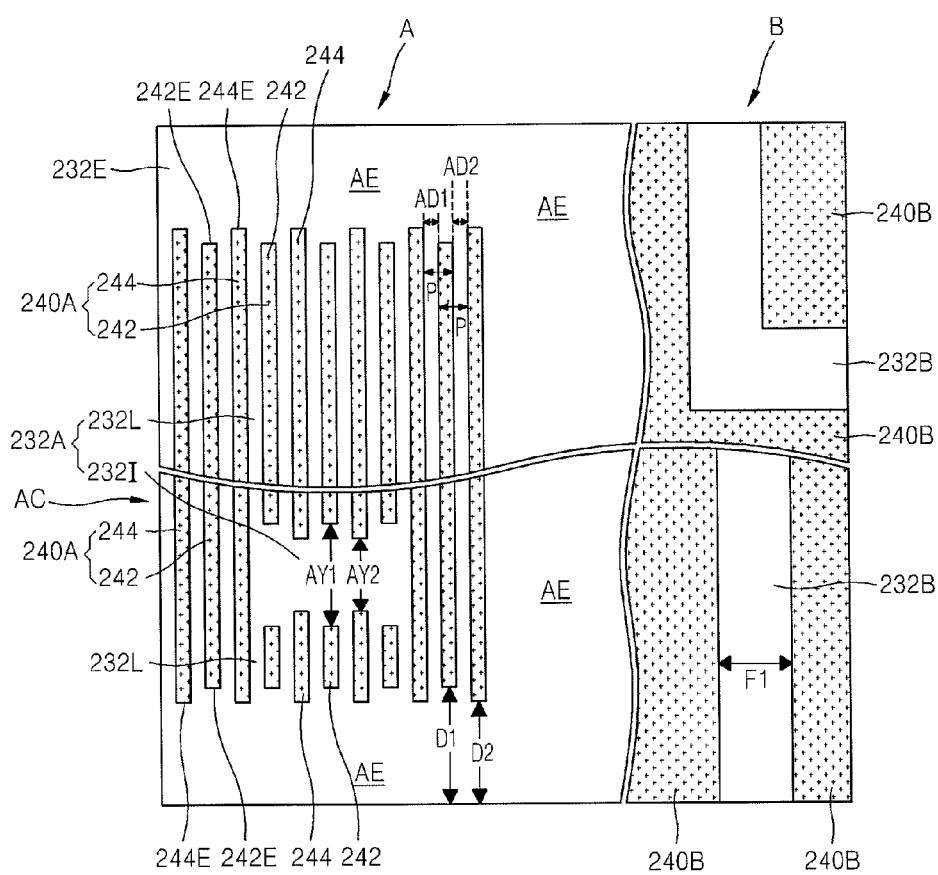
FIG. 2 is a layout of a structure of a part of a semiconductor device that can be manufactured using the pattern forming method according to the inventive concept.

FIG. 2 is a layout of a structure of a part of a semiconductor device 200 that can be manufactured using the pattern forming method according to the inventive concept.

Referring to FIG. 2, a first region A may be a cell array region in which unit memories are formed. For example, the cell array 32 of FIG. 1 may be formed in the first region A. A second region B may be a peripheral circuit region or a core region in which peripheral circuits for operating the unit memories formed in the cell array region are formed. Alternatively, the second region B may be a portion of the cell array region in which patterns having large widths are formed.

In FIG. 2, a layout of an active region 232A defined by a plurality of isolation films 240A having relatively small widths is illustrated in the first region A, and a layout of an active region 232B defined by a plurality of isolation films 240B having relatively large widths is illustrated in the second region B.

In FIG. 2, the first region A includes an edge portion AE including upper, lower, right, and left sides of the first region A, and a center portion AC surrounded by the edge portion AE. FIG. 2 illustrates a part of the first region A which includes edge portions AE of upper and lower sides of the first region A and an edge portion AE of a right side of the first region A, which can be seen on the right side of the center portion AC of FIG. 2.

In the center portion AC and the edge portion AE of the first region A, the active regions 232A and 232E are defined by the plurality of isolation films 240A.

In the first region A, the plurality of isolation films 240A may be a plurality of line patterns extending parallel to each other in a certain direction, for example, in direction y of FIG. 2. Each of the plurality of isolation films 240A may have a width equal to a width of each of a plurality of line-type active regions 232L in direction x of FIG. 2. However, the inventive concept is not limited to the illustrated width, and the widths of each of the plurality of line-type active regions 232L and the widths of the plurality of isolation films 240A may be set to various other values according to desired configurations.

The plurality of isolation films 240A includes a plurality of first isolation films 242 having first ends 242E apart from the outline of the first region A by a relatively long distance D1 in the edge portion AE of the first region A, and a plurality of second isolation films 244 having second ends 244E apart from the outline of the first region A by a relatively short distance D2 in the edge portion AE of the first region A. In the first region A, the first isolation films 242 and the second isolation films 244 alternate with each other one by one and extend parallel to each other.

The plurality of first isolation films 242 may include two adjacent first isolation films 242 that are lined up in a certain direction, for example, in direction y of FIG. 2, and apart from each other by a distance AY1. The plurality of second isolation films 244 may include two adjacent second isolation films 244 that are lined up in a certain direction, for example, in direction y of FIG. 2, and apart from each other by a distance AY2. Regions corresponding to the distances AY1 and AY2 between the first isolation films 242 and between the second isolation films 244 may serve as non-pattern regions in which the isolation films 240A are not formed. The distance AY2 may be smaller than the distance AY1.

An active region 232E may be defined in the edge portion AE of the first region A. The plurality of line-type active regions 232L may be defined by the plurality of isolation films 240A within at least a part of the center portion AC of the first region A, and extend in lines in direction y between the first and second isolation films 242 and 244 of the plurality of isolation films 240A. The plurality of line-type active regions 232L may be arranged at equal intervals. The plurality of line-type active regions 232L may be repeated at a fine pitch P while having uniform widths AD1 or AD2 and having pairs of the isolation films 240A on both sides of each of the line-type active regions 232L in the center portion AC of the first region A.

A plurality of word lines (not shown) may extend on the plurality of line-type active regions 232L. The word lines may extend in a direction perpendicular to the direction in which the line-type active regions 232L extend (i.e., the direction perpendicular is direction x in FIG. 2). The plurality of line-type active regions 232L and the plurality of word lines located on the line-type active regions 232L may form a plurality of cell strings.

In a part of the first region A, island-type active regions 232I may be defined by adjacent first isolation films 242 and also defined by adjacent second isolation films 244. The island-type active regions 232I may be connected to parts of the plurality of line-type active regions 232L.

In the island-type active regions 232I, potential control wells (not shown) may be formed to control the potential of a well on which a plurality of cell strings are formed within the first region A. Contacts (not shown) connected to potential control lines (not shown) may be formed on the potential control wells formed on the island-type active regions 232I.

FIG. 3A through FIG. 10C are views illustrating a method of forming patterns for a semiconductor device 200, according to an embodiment of the inventive concept. FIG. 3A through FIG. 10C illustrate a method of forming the isolation films 240A and the isolation films 240B, which define the active regions 232A and 232E and the active region 232B in the first and second regions A and B, respectively, according to the layout of FIG. 2. More specifically, FIGS. 3A, 4A, 5A, 6A, 7A, 8A, 9A and 10A are plan views illustrating a region of the semiconductor device 200 of FIG. 2; FIGS. 3B, 4B, 5B, 6B, 7B, 8B, 9B and 10B contain cross-sectional views taken along planes X1-X1', X2-X2', and X3-X3' of FIGS. 3A, 4A, 5A, 6A, 7A, 8A, 9A and 10A, respectively; and FIGS. 3C, 4C, 5C, 6C, 7C, 8C, 9C and 10C contain cross-sectional views taken along a plane Y1-Y1' of FIGS. 3A, 4A, 5A, 6A, 7A, 8A, 9A and 10A, respectively.

Like reference numerals in FIGS. 3A through 10C denote like elements, and description of like elements will not be repeated.

Figure 3A:
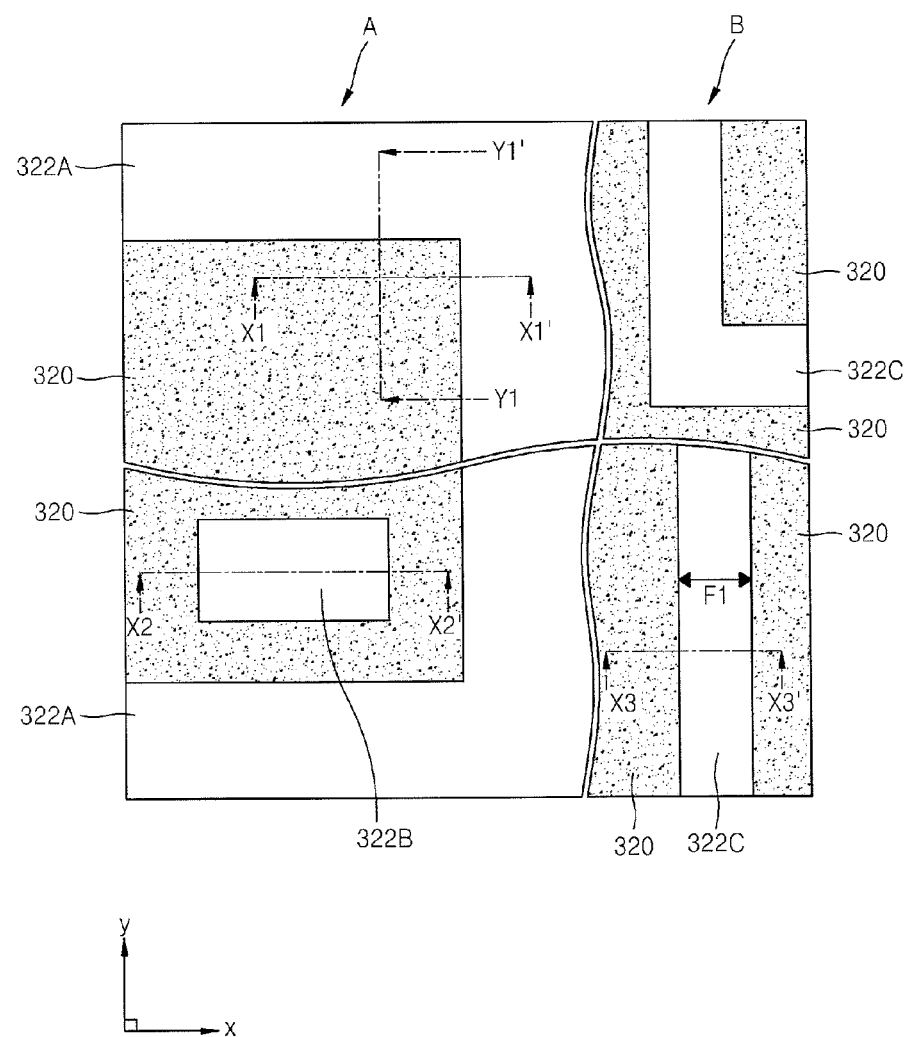
Figure 3B:
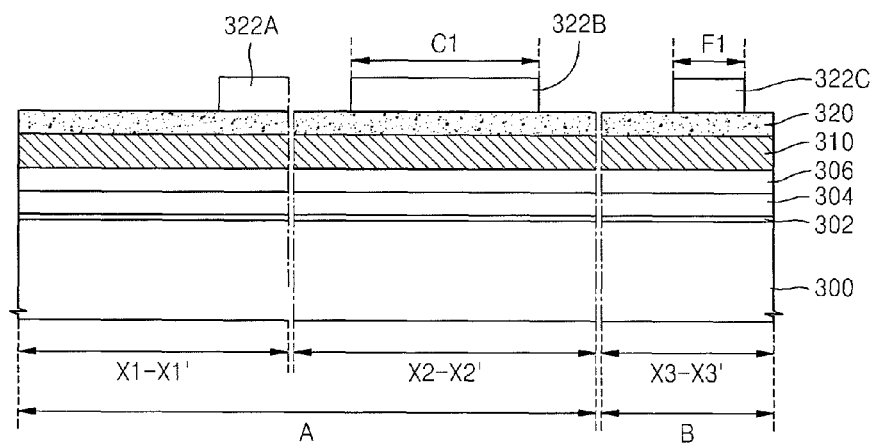
FIGS. 3B, 4B, 5B, 6B, 7B, 8B, 9B and 10B contain cross-sectional views taken along planes X1-X1', X2-X2', and X3-X3' of FIGS. 3A, 4A, 5A, 6A, 7A, 8A, 9A and 10A, respectively.
Figure 3C:
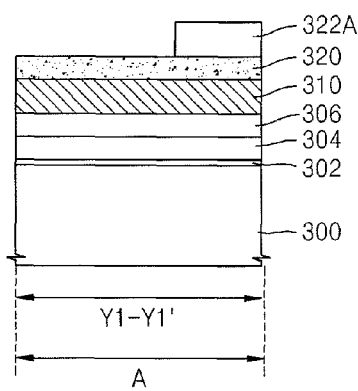

Referring to FIGS. 3A, 3B, and 3C, a substrate 300 having the first and second regions A and B is prepared. The first region A may be a cell array region.

A pad oxide film 302 is formed on the first and second regions A and B of the substrate 300. A first hard mask layer 304, a second hard mask layer 306, and a buffer mask layer 310 are sequentially formed on the pad oxide film 302.

The substrate 300 may be a typical semiconductor substrate such as a silicon substrate.

Each of the first and second hard mask layers 304 and 306 may be a single-layered structure. Alternatively, each of the first and second hard mask layers 304 and 306 may be a multi-layered structure obtained by stacking at least two hard mask layers having different etching characteristics under predetermined etching conditions. For example, the first hard mask layer 304 may be a silicon nitride layer, and the second hard mask layer 306 may be a silicon oxide layer. The buffer mask layer 310 may be a polysilicon layer.

Thereafter, a large-width mask layer 320 for forming large-width patterns is formed on the first and second regions A and B. The large-width mask layer 320 is formed of a material having an etching selectivity to the buffer mask layer 310. For example, the large-width mask layer 320 may be a silicon oxide film.

Mask patterns 322A, 322B, and 322C are formed on the large-width mask layer 320 by using a photolithographic process. The mask pattern 322A is an edge-blocking mask pattern for blocking an edge portion of the first region A, in which no patterns are formed. The mask pattern 322B is a blocking mask pattern that is formed in a non-pattern region required to form the island-type active regions 232I in the first region A. The mask pattern 322C is a large-width mask pattern corresponding to a layout of the active region 232B desired to be formed in the second region B. Each of the mask patterns 322A, 322B, and 322C may be obtained by stacking a carbon-containing film (hereinafter, referred to as a spin-on organic hardmask (SOH) film, an SiON film, and a photoresist film.

The blocking mask pattern 322B formed in the first region A may have a width C1 in direction x. The width C1 is not necessarily equal to a width of the island-type active regions 232I in direction x, and a location in which the blocking mask pattern 322B is formed may have a relatively sufficient alignment margin. Accordingly, even when the location in which the blocking mask pattern 322B is a predetermined distance shifted from the location of the island-type active regions 232I, the island-type active regions 232I may be defined in an accurate predesigned location by using the blocking mask pattern 322B through subsequent processes.

The large-width mask pattern 322C formed in the second region B has a shape corresponding to a layout of the active region 232B (see FIG. 2) and a width F1 equal to the width of the active region 232B.

Figure 4A:
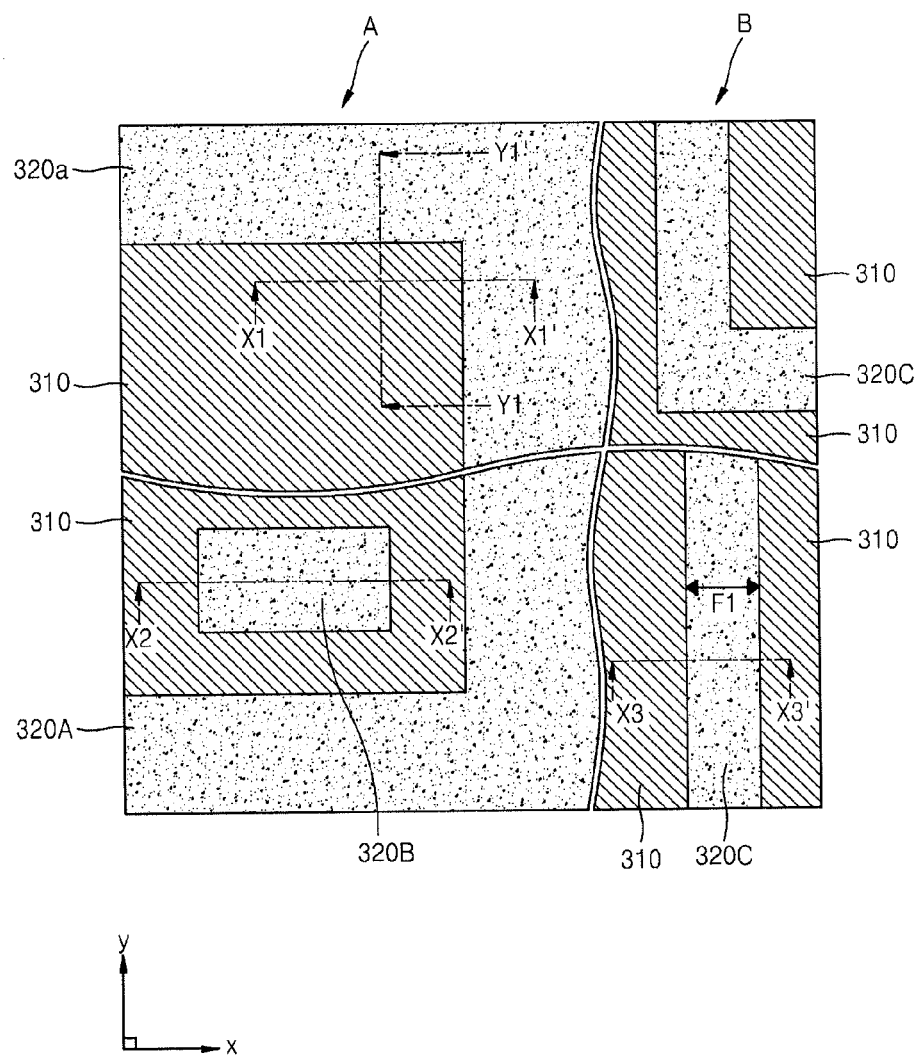
Figure 4B:
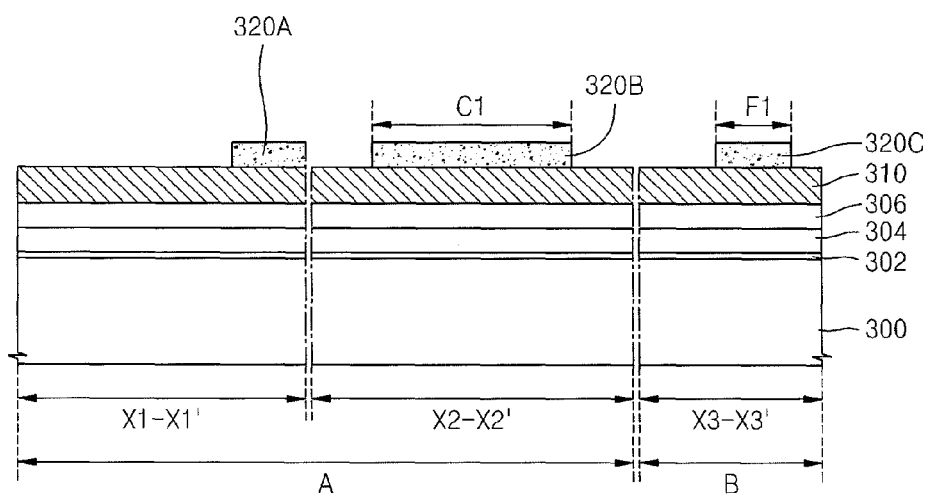
Figure 4C:
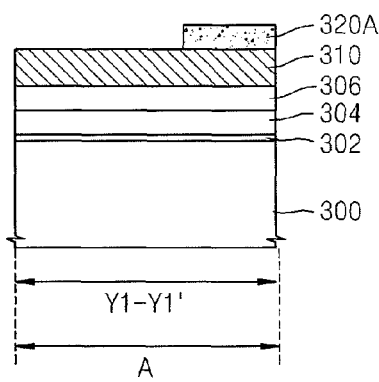

Referring to FIGS. 4A, 4B, and 4C, the large-width mask layer 320 is etched using the mask patterns 322A, 322B, and 322C as an etch mask in the first and second regions A and B, thereby forming large-width patterns 320A, 320B, and 320C in the first and second regions A and B. The large-width pattern 320A is an edge-blocking pattern for blocking an edge portion of the first region A, in which no patterns are formed. The large-width pattern 320B is a blocking pattern that is formed in a non-pattern region required to form the island-type active regions 232I in the first region A. The large-width pattern 320C is a low-density large-width pattern corresponding to the layout of the active region 232B desired to be formed in the second region B.

Thereafter, upper surfaces of the large-width patterns 320A, 320B, and 320C are exposed in the first and second regions A and B by removing the mask patterns 322A, 322B, and 322C.

Figure 5A:
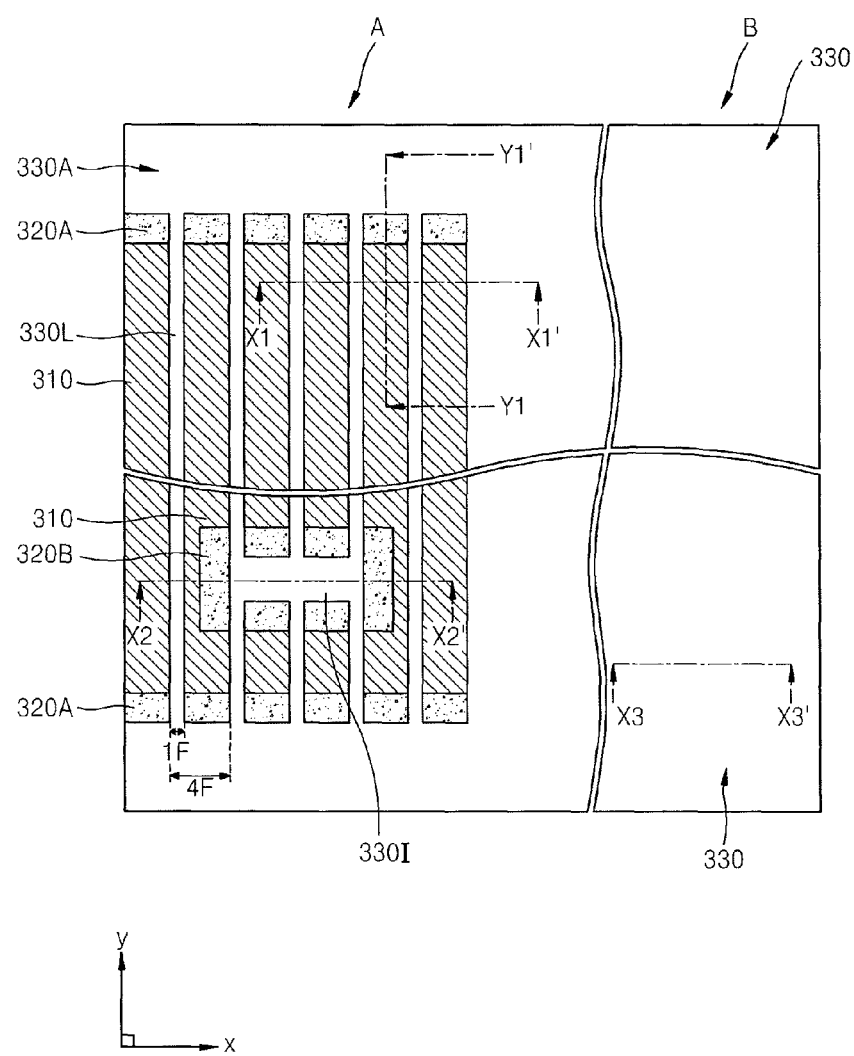
Figure 5B:
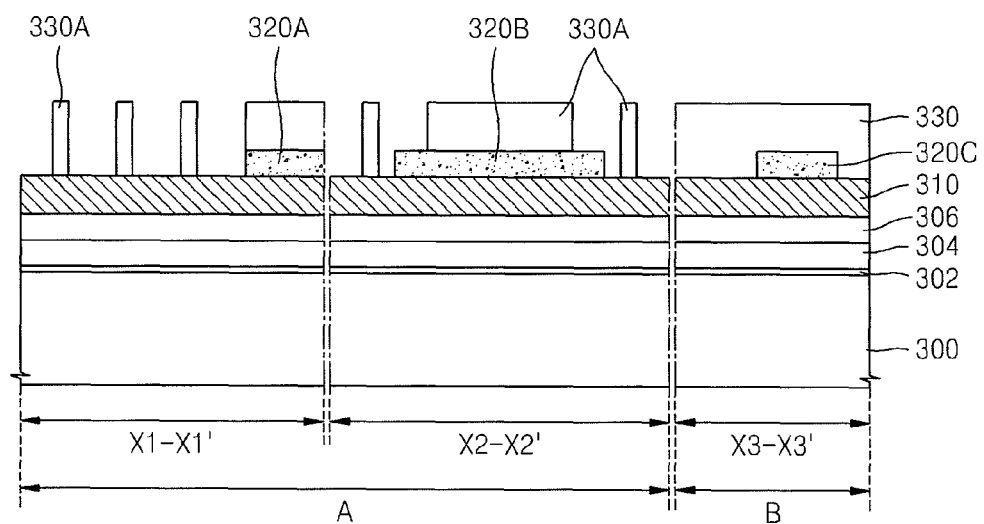
Figure 5C:
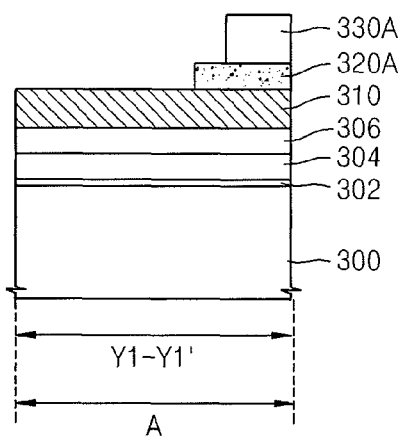

Referring to FIGS. 5A, 5B, and 5C, a sacrificial mask layer 330 is formed on the first and second regions A and B so as to completely cover a resultant structure in which the upper surfaces of the large-width patterns 320A, 320B, and 320C are exposed. Then, a portion of the sacrificial mask layer 330 on the second region B is not patterned and maintained as it is, whereas a portion of the sacrificial mask layer 330 on the first region A is patterned using a photolithographic process so as to produce a sacrificial mask pattern 330A including a plurality of line portions 330L extending parallel to each other in direction y in the first region A. The plurality of line portions 330L are connected to each other at the edge portion of the first region A. A portion of the large-width pattern 320A is exposed via spaces between the plurality of line portions 330L.

In the center portion of the first region A, the sacrificial mask pattern 330A may include an island portion 330I having a relatively large width, which is located in a portion where the island-type active regions 232I (see FIG. 2) are to be defined. The plurality of line portions 330L may be connected to each other by the island portion 330I. Each of the plurality of line portions 330L of the sacrificial mask pattern 330A may have a width corresponding to a minimum feature size (1 F) of a memory cell in order to define the plurality of line-type active regions 232L (see FIG. 2) each having the width 1 F. The plurality of line portions 330L may be repeated at a pitch 4 F in direction x.

A portion of the blocking pattern 320B located below the island portion 330I may be exposed around the island portion 330I. However, according to the inventive concept, the blocking pattern 320B may have a size smaller than the island portion 330I so as not to be exposed around the island portion 330I. Even in this case, a desired pattern may be formed using a method according to the inventive concept.

In the second region B, the low-density large-width pattern 320C is completely covered with the sacrificial mask layer 330.

The sacrificial mask layer 330 may have a stacked structure including an SOH film and a SiON film. A method of forming the sacrificial mask layer 330 with a stacked structure including an SOH film and a SiON film will now be described. First, an organic compound layer is formed on a resultant structure in which the upper surfaces of the large-width patterns 320A, 320B, and 320C are exposed. At this time, spin coating or deposition may be performed to form the organic compound layer. The organic compound layer may be formed of a hydrogen carbide compound including an aromatic ring such as phenyl, benzene, or naphthalene, or derivatives thereof. The organic compound layer may be composed of a material having a relatively high carbon content, namely, of about 85 to 99% by weight of carbon. The organic compound layer undergoes a first baking process at a temperature of about 150 to about 350° C., thereby forming the SOH film. The first baking process may be performed for about 60 seconds. Then, the SOH layer undergoes a second baking process at a temperature of about 300° C. to about 550° C. so as to be hardened. The second baking process may be performed for about 30 to about 300 seconds. This hardening of the SOH layer according to the second baking process prevents the SOH layer from being affected by a deposition process, in which a material is deposited at a relatively high temperature of about 400° C. or greater, in order to form another layer on the SOH layer. Thereafter, the sacrificial mask pattern 330A may be formed by sequentially etching the SiON film and the SOH film according to a photolithographic process in which a photoresist pattern (not shown) is used as an etch mask. When the SOH film is etched, the SiON film may be used as an etch mask for etching the SOH film.

Figure 6A:
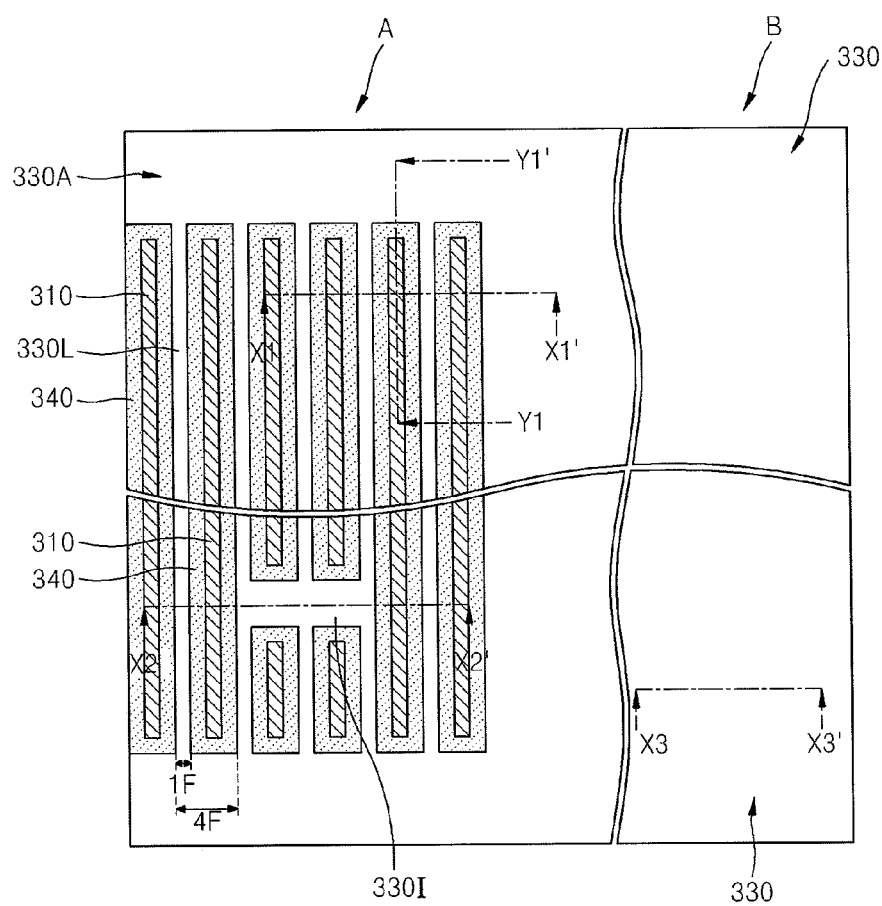
Figure 6B:
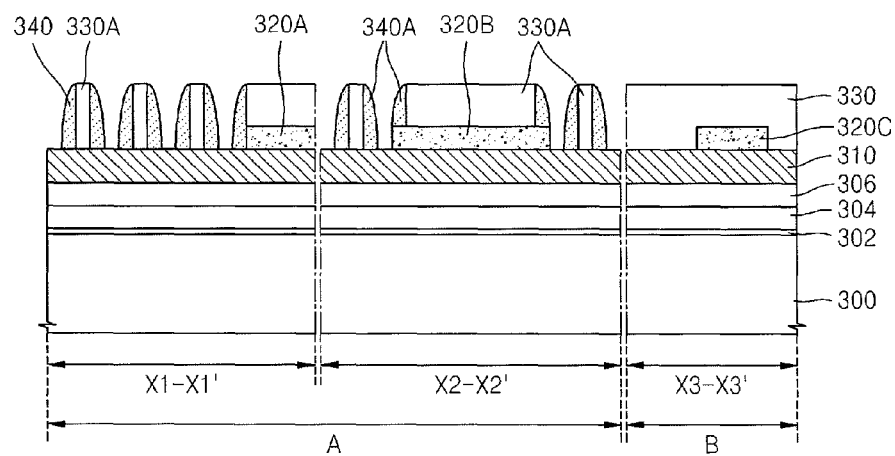
Figure 6C:
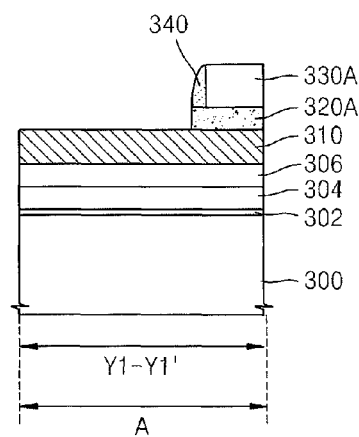

Referring to FIGS. 6A, 6B, and 6C, a spacer mask layer covering exposed surfaces of the sacrificial mask pattern 330A and the sacrificial mask layer 330 and exposed surfaces of the edge-blocking pattern 320A, the blocking pattern 320B, and the buffer mask layer 310 in the first region A is formed on a resultant structure in which the sacrificial mask pattern 330A is formed in the first region A and the sacrificial mask layer 330 is formed in the second region B. The spacer mask layer may be formed to a uniform thickness on the substrate 100 by atomic layer deposition (ALD). Thereafter, the spacer mask layer is etched until the upper surfaces of the sacrificial mask pattern 330A and the sacrificial mask layer 330 are exposed, thereby forming a plurality of spacers 340 covering sidewalls of the sacrificial mask pattern 330A in the first region A.

The plurality of spacers 340 may be formed of a material having different etching selectivities with respect to the sacrificial mask pattern 330A, the sacrificial mask layer 330, and the buffer mask layer 310. For example, the plurality of spacers 340 may be formed of an oxide film. If the edge-blocking pattern 320A, the blocking pattern 320B, and the low-density large-width pattern 320C are formed of a silicon oxide film, when the edge-blocking pattern 320A and the blocking pattern 320B are exposed while the spacer mask layer is being etched to form the plurality of spacers 340, the exposed edge-blocking pattern 320A and the exposed blocking pattern 320B are also etched together with the spacer mask layer. Consequently, the edge-blocking pattern 320A and the blocking pattern 320B are also etched in spaces between the spacers 340, and thus the upper surface of the buffer mask layer 310 is only exposed in the spaces between the plurality of spacers 340.

Figure 7A:
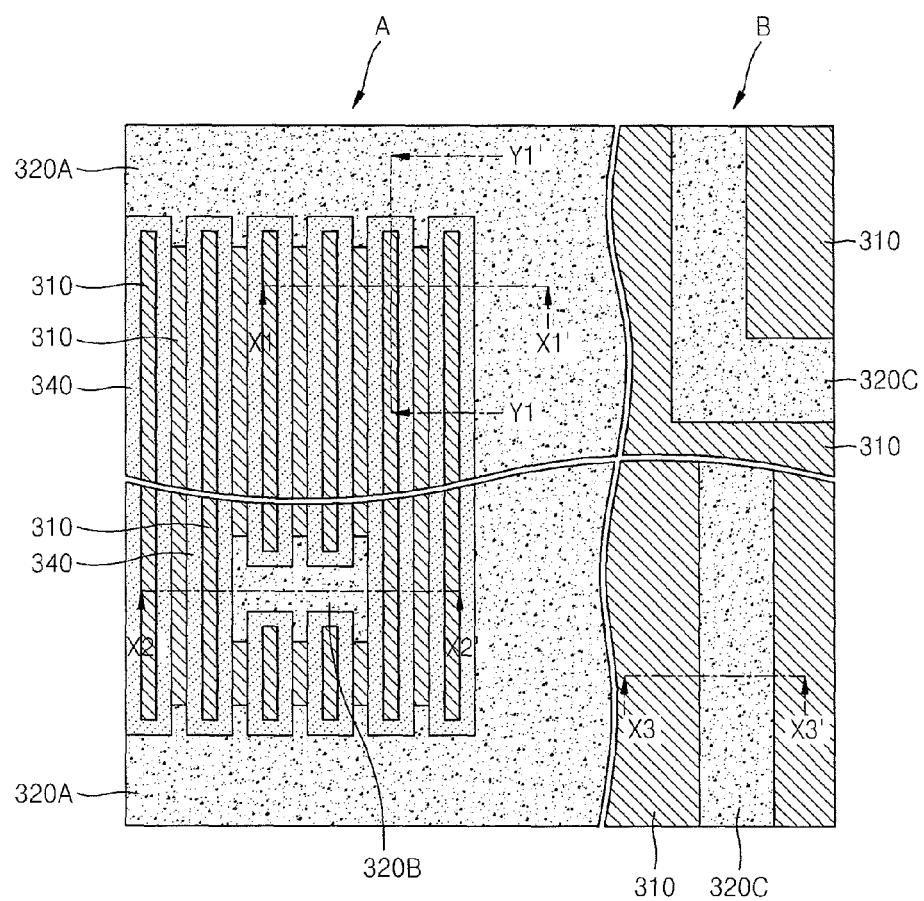
Figure 7B:
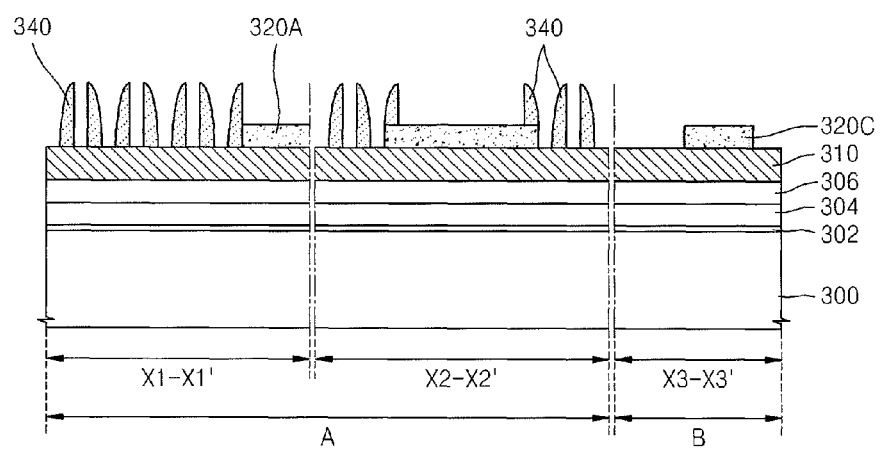
Figure 7C:
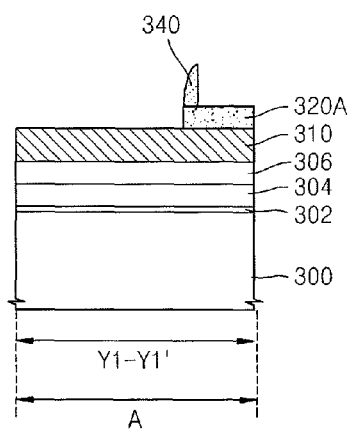

Referring to FIGS. 7A, 7B, and 7C, the sacrificial mask pattern 330A existing in the first region A and the sacrificial mask layer 330 existing in the second region B are removed from a resultant structure in which the plurality of spacers 340 have been formed. Consequently, the buffer mask layer 310 and the blocking pattern 320B are exposed through the spaces between the plurality of spacers 340 in the center portion of the first region A, and the edge-blocking pattern 320A is exposed in the edge portion of the first region A. The low-density large-width pattern 320C and the buffer mask layer 310 are exposed in the second region B.

Figure 8A:
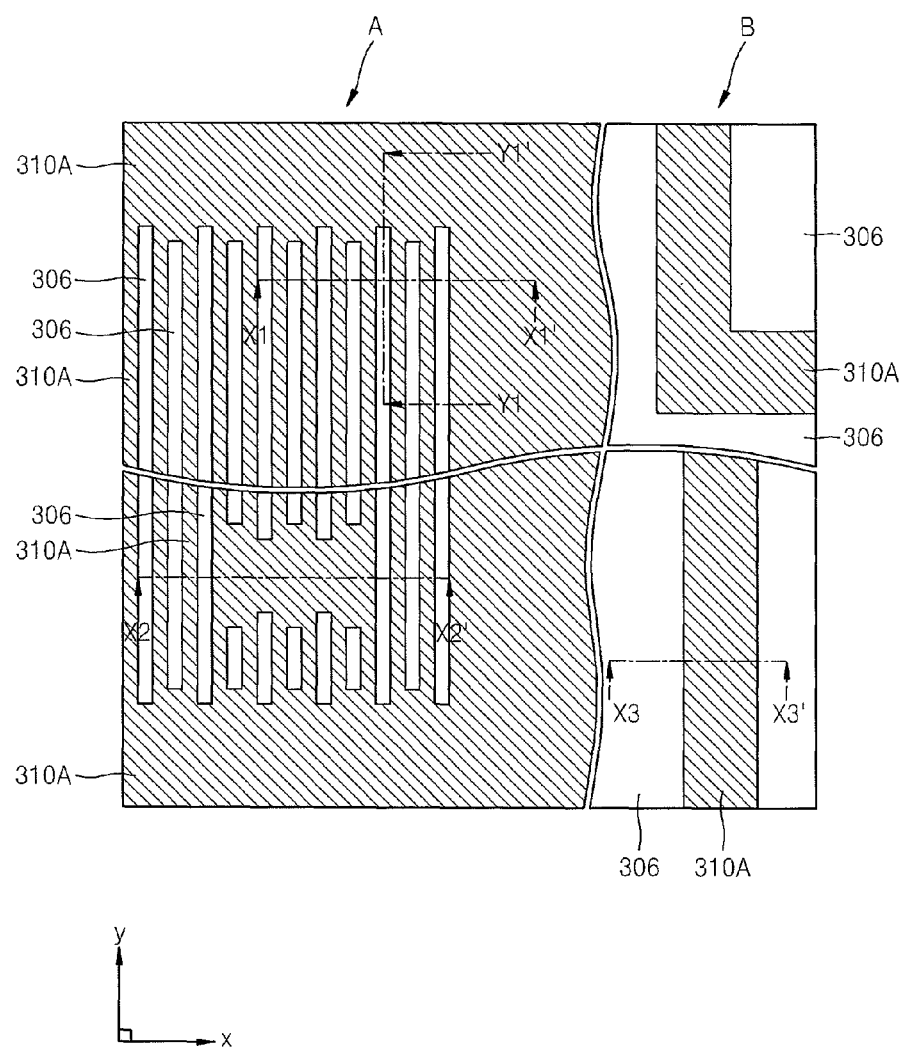
Figure 8B:
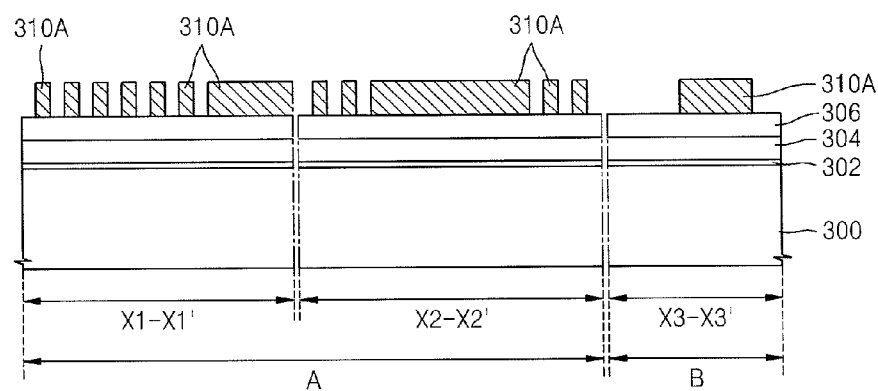
Figure 8C:
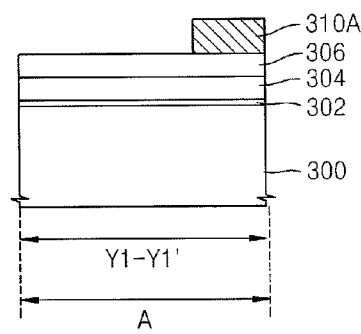

Referring to FIGS. 8A, 8B, and 8C, the buffer mask layer 310 is etched using the plurality of spacers 340, the blocking pattern 320B, and the edge-blocking pattern 320A as an etch mask in the first region A and using the low-density large-width pattern 320C as an etch mask in the second region B, thereby forming a buffer mask pattern 310A. The buffer mask pattern 310A includes portions that were covered with the plurality of spacers 340, the blocking pattern 320B, and the edge-blocking pattern 320A in the first region A and portions that were covered with the low-density large-width pattern 320C in the second region B. The second hard mask layer 306 is exposed through the buffer mask pattern 310A in the first and second regions A and B.

Thereafter, the plurality of spacers 340, the blocking pattern 320B, the edge-blocking pattern 320A, and the low-density large-width pattern 320C used as an etch mask are removed. In some cases, the plurality of spacers 340, the blocking pattern 320B, the edge-blocking pattern 320A, and the low-density large-width pattern 320C used as an etch mask may not be removed, that is, may be left as they are. A subsequent etching process may be performed on a resultant structure in which the plurality of spacers 340, the blocking pattern 320B, the edge-blocking pattern 320A, and the low-density large-width pattern 320C are left.

Figure 9A:
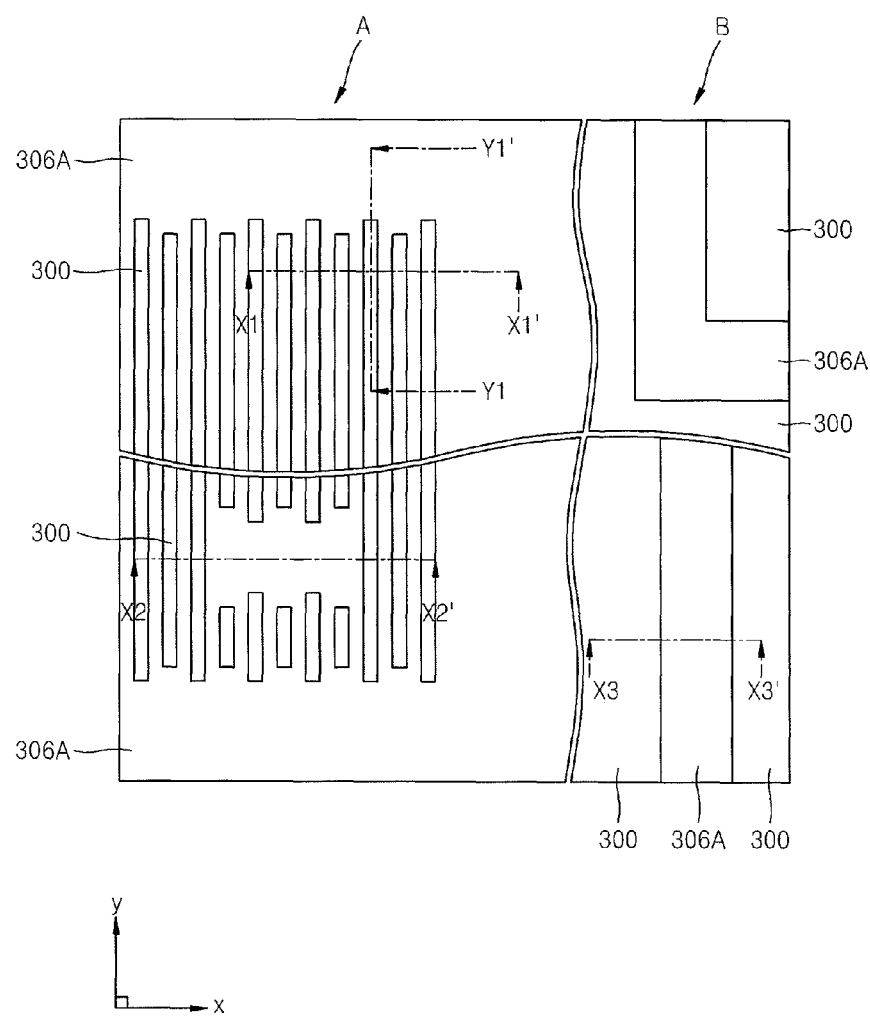
Figure 9B:
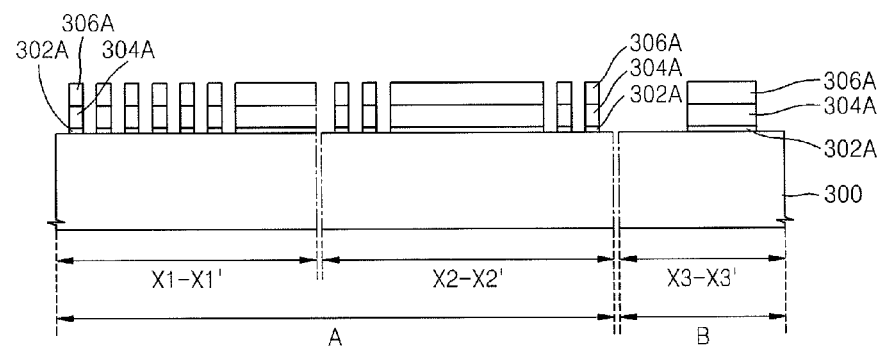
Figure 9C:
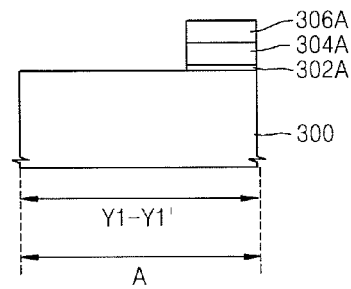

Referring to FIGS. 9A, 9B, and 9C, the exposed portions of the second hard mask layer 306 are etched using the buffer mask pattern 310A as an etch mask in the first and second regions A and B, thereby forming a second hard mask pattern 306A. Then, exposed portions of the first hard mask layer 304 are etched using the second hard mask pattern 306A as an etch mask, thereby forming a first hard mask pattern 304A.

While the exposed portions of the first hard mask layer 304 are being etched, the pad oxide film 302 may also be etched to form a pad oxide film pattern 302A. Thus, the substrate 300 may be exposed through the first hard mask pattern 304A and the second hard mask pattern 306A.

Although not shown in FIGS. 9A, 9B, and 9C, after the first hard mask pattern 304A and the second hard mask pattern 306A are formed, residual layers of the buffer mask pattern 310A may remain on the second hard mask pattern 306A.

A plurality of exposed portions of the substrate 300 that are exposed through the second hard mask pattern 306A may extend parallel to each other in a certain direction, that is, in direction y of FIG. 9A. Two lengths of the plurality of exposed portions of the substrate 300 may alternate in direction y.

Figure 10A:
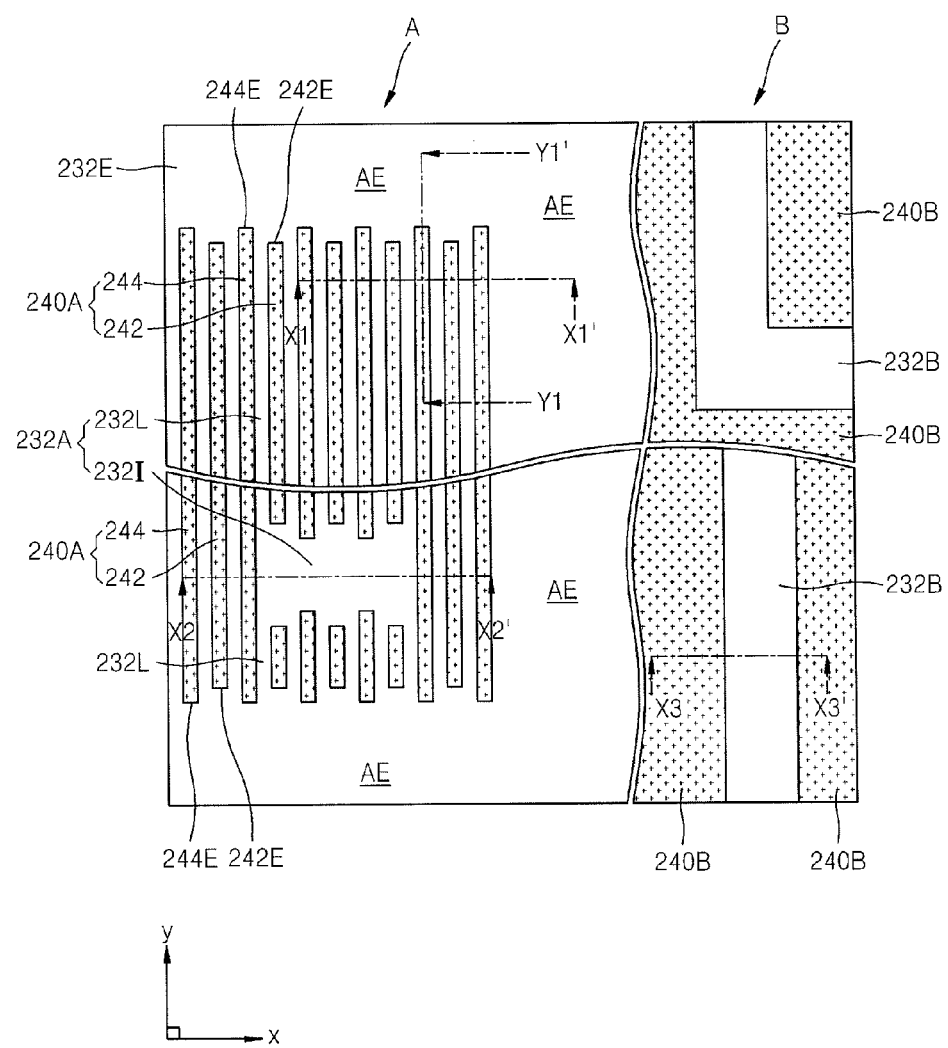
Figure 10B:
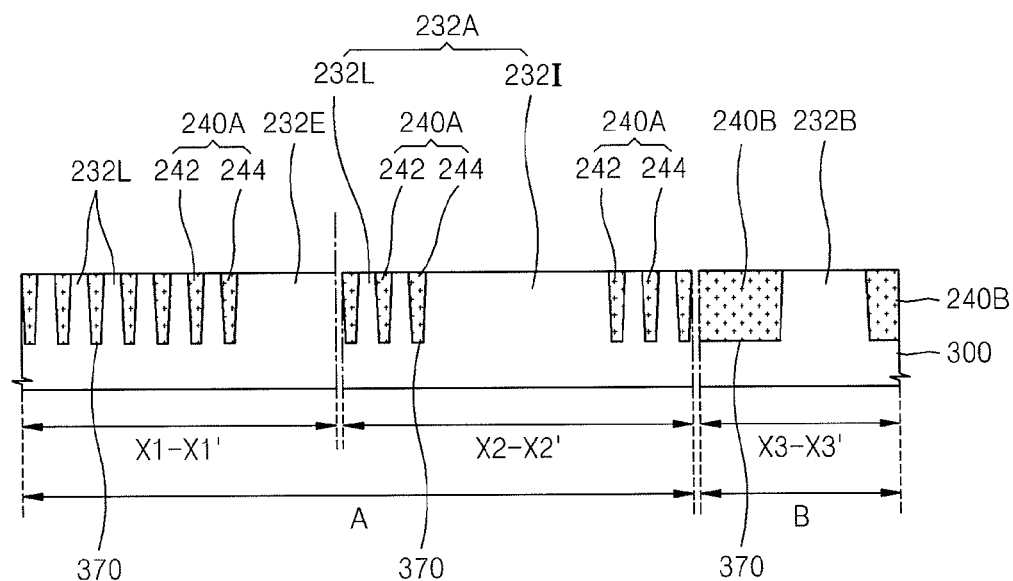
Figure 10C:
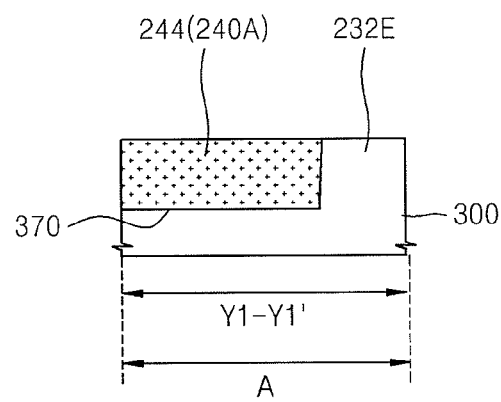

Referring to FIGS. 10A, 10B, and 10C, the exposed portions of the substrate 300 are etched using the first and second hard mask pattern 304A and 306A as an etch mask, thereby forming a plurality of trenches 370 in the substrate 300.

Thereafter, an insulation material is deposited on the substrate 300 to completely fill the plurality of trenches 370, and then planarized by chemical mechanical polishing (CMP), thereby forming isolation films 240A having relatively small widths within the plurality of trenches 370 in the first region A and forming isolation films 240B having relatively large widths within the plurality of trenches 370 in the second region B. Then, unnecessary films remaining on the substrate 300 are removed so that the upper surface of the substrate 300 is exposed, thereby completing a resultant structure illustrated in FIG. 2.

FIG. 11A through FIG. 18B are views illustrating a method of forming patterns for a semiconductor device, according to another embodiment of the inventive concept. More specifically, FIGS. 11A, 12A, 13A, 14A, 15A, 16A, 17A and 18A are plan views illustrating a method of forming patterns for a semiconductor device; and FIGS. 11B, 12B, 13B, 14B, 15B, 16B, 17B and 18B contain cross-sectional views taken along planes X11A-X11A' and X11B-X11B' of FIGS. 11A, 12A, 13A, 14A, 15A, 16A, 17A and 18A, respectively. A first region A may be a cell array region in which unit memories are formed. For example, the cell array 32 of FIG. 1 may be formed in the first region A. A second region B may be a peripheral circuit region or a core region in which peripheral circuits for operating the unit memories formed in the cell array region are formed.

In the semiconductor device patterns forming method illustrated in FIG. 11A through FIG. 18B, patterns for a semiconductor device including a plurality of damascene metallization lines arranged with uniform widths at regular intervals on a substrate 400 are formed. The damascene metallization lines formed in the method of FIG. 11A through FIG. 18B may constitute a plurality of bit lines or a plurality of metal metallization layers that are necessary in the formation of memory cells of the semiconductor device. Same reference numerals as those in FIGS. 3A through 10C denote same elements, and thus their description will not be repeated.

Figure 11A:
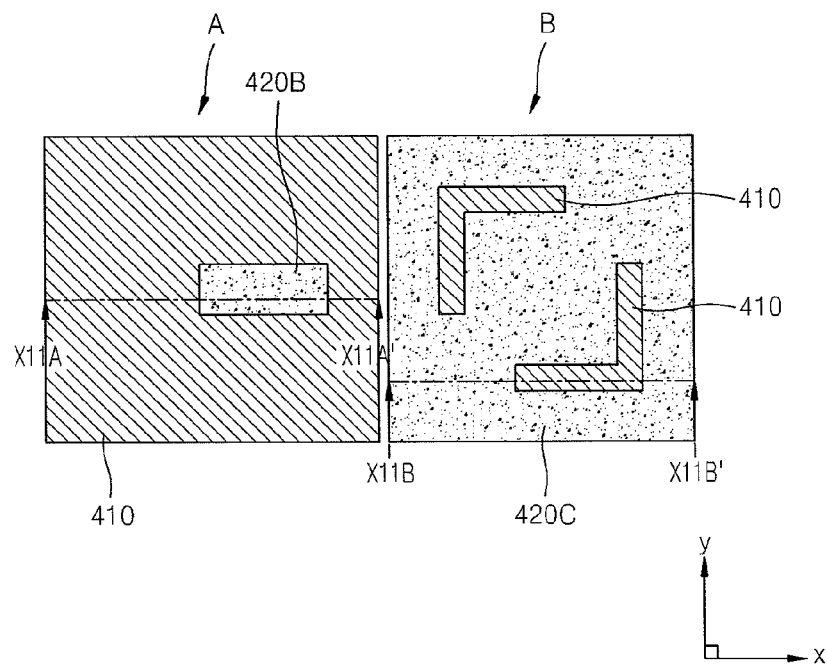
Figure 11B:
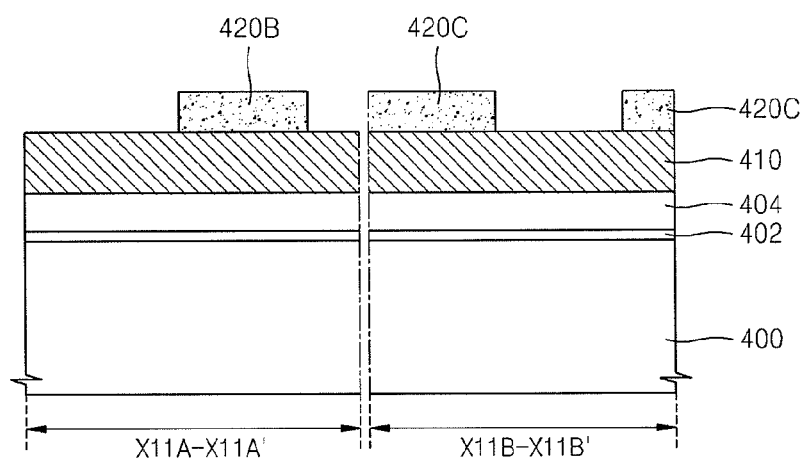

Referring to FIGS. 11A and 11B, an etching stop layer 402 is formed on the substrate 400 on which unit elements, for example, a plurality of word lines, and an interlayer insulation film covering the unit elements have been formed. A mold layer 404 is formed on the etching stop layer 402. For example, the etching stop layer 402 may be a silicon nitride layer, and the mold layer 404 may be an oxide layer.

A buffer mask layer 410 is formed on the mold layer 404. Detailed features of the buffer mask layer 410 are the same as those of the buffer mask layer 310 described above with reference to FIGS. 3A through 3C.

Then, a blocking pattern 420B and a low-density large width pattern 420C are formed on the buffer mask layer 410 in the first region A and the second region B, respectively, in the same method as the method described with respect to the blocking pattern 320B and the low-density large-width pattern 320C with reference to FIGS. 3A through 4C. The shapes and sizes of the blocking pattern 420B and the low-density large width pattern 420C are not limited to those illustrated in FIGS. 11A and 11B, and may vary according to the design of the semiconductor device.

Figure 12A:
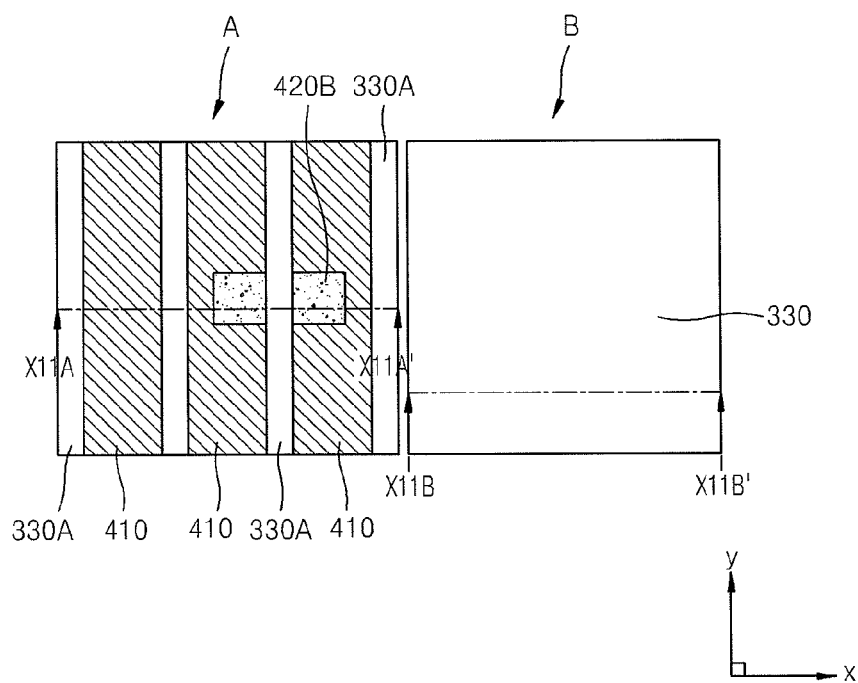
Figure 12B:
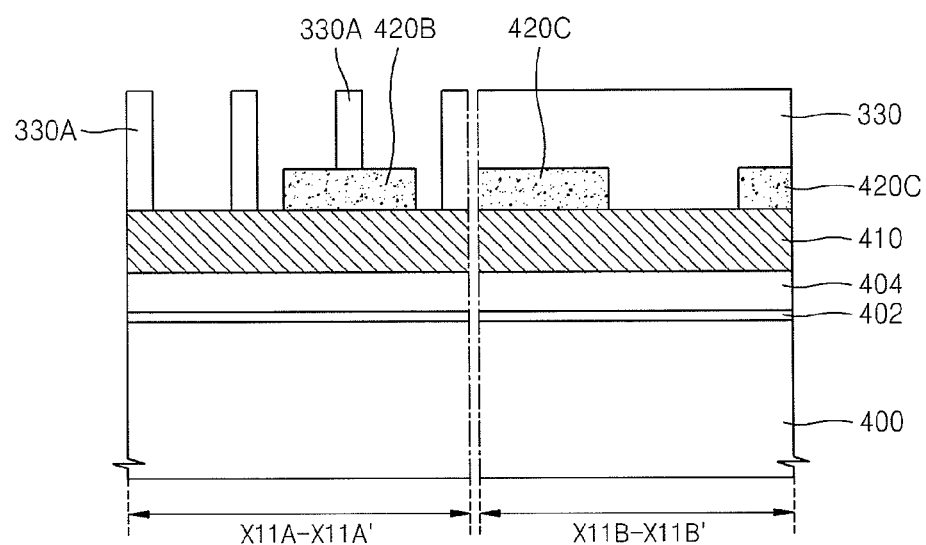

Referring to FIGS. 12A and 12B, a sacrificial mask layer 330 is formed on the blocking pattern 420B and the low-density large width pattern 420C in the first and second regions A and B. Then, only a portion of the sacrificial mask layer 330 in the first region A is patterned using a photolithographic process so as to produce a plurality of sacrificial mask patterns 330A extending parallel to each other in the first region A.

Figure 13A:
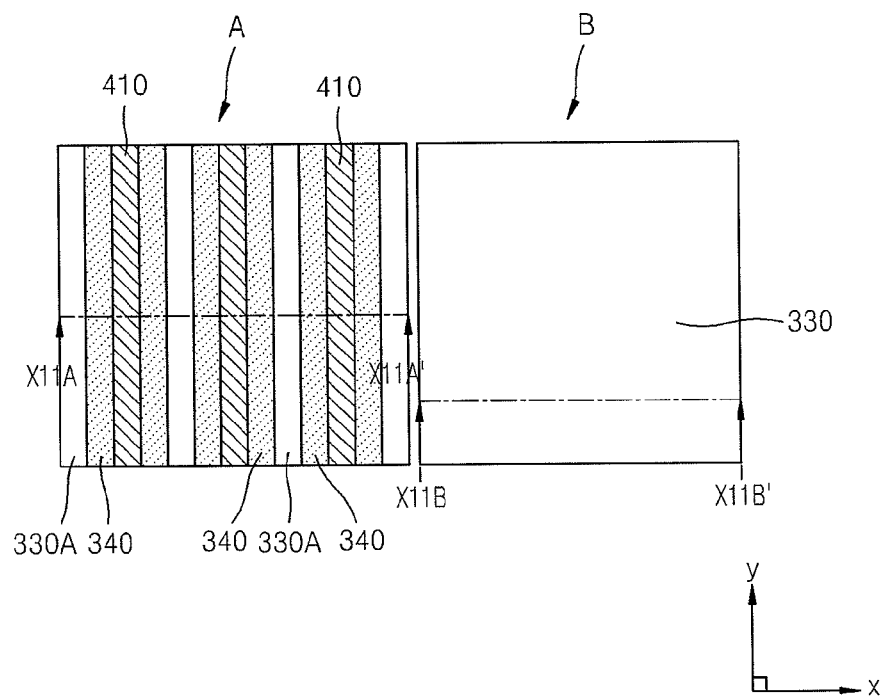
Figure 13B:
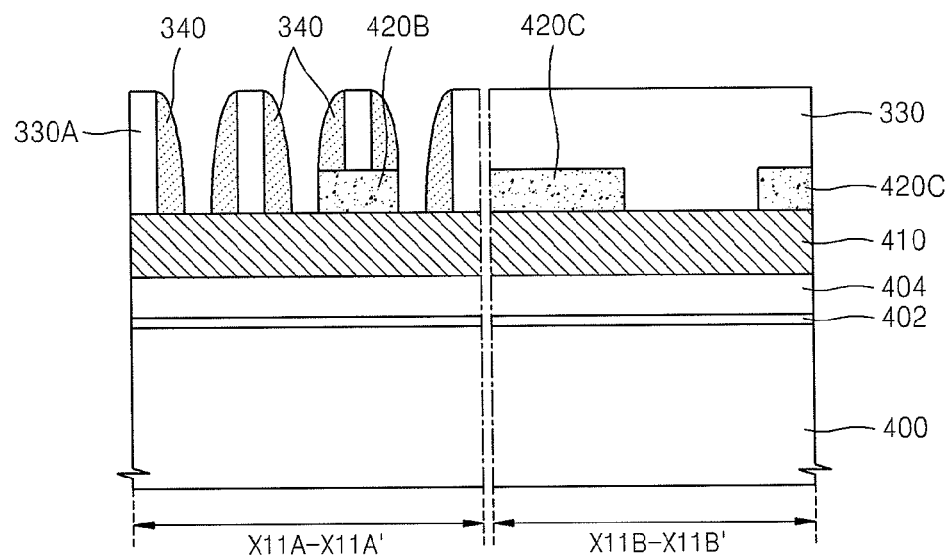

Referring to FIGS. 13A and 13B, a plurality of spacers 340 covering sidewalls of the plurality of sacrificial mask patterns 330A are formed in the first region A in the same method as the method described above with reference to FIGS. 6A through 6C.

Figure 14A:
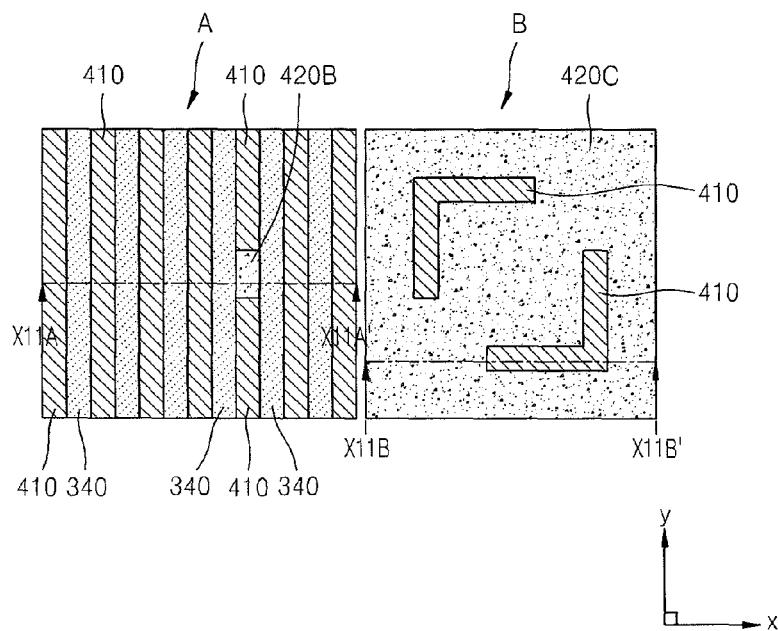
Figure 14B:
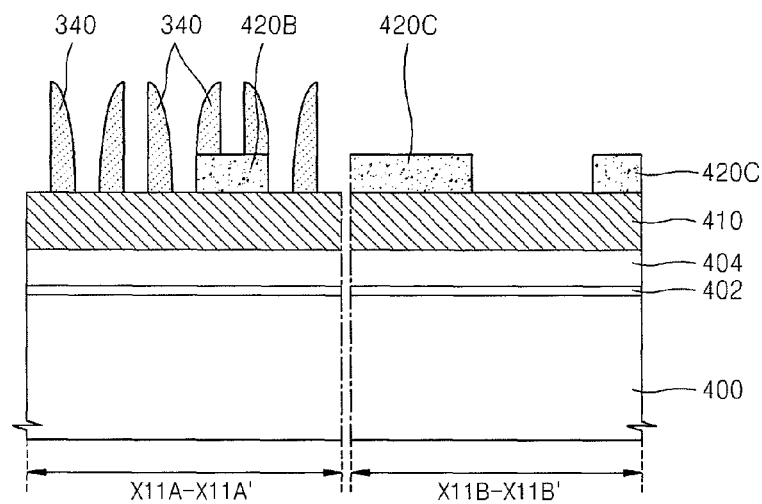

Referring to FIGS. 14A and 14B, in the same method as that described above with reference to FIGS. 7A through 7C, the plurality of sacrificial mask patterns 330A existing in the first region A and the sacrificial mask layer 330 existing in the second region B are removed from a resultant structure in which the plurality of spacers 340 have been formed, thereby exposing the buffer mask layer 410 and the blocking pattern 420B through the spaces between the plurality of spacers 340 in the first region A and exposing the low-density large-width pattern 420C and the buffer mask layer 410 in the second region B.

Figure 15A:
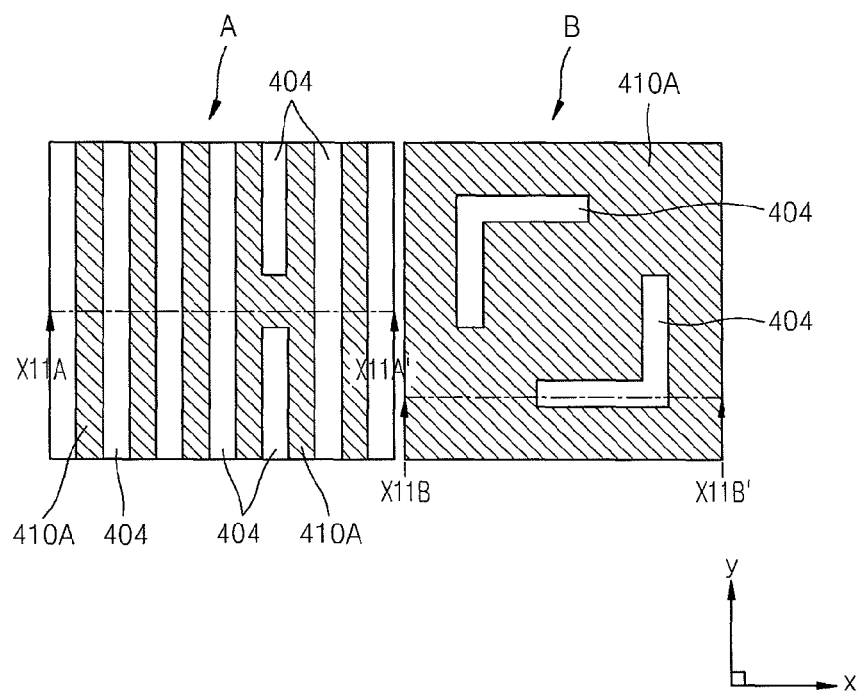
Figure 15B:
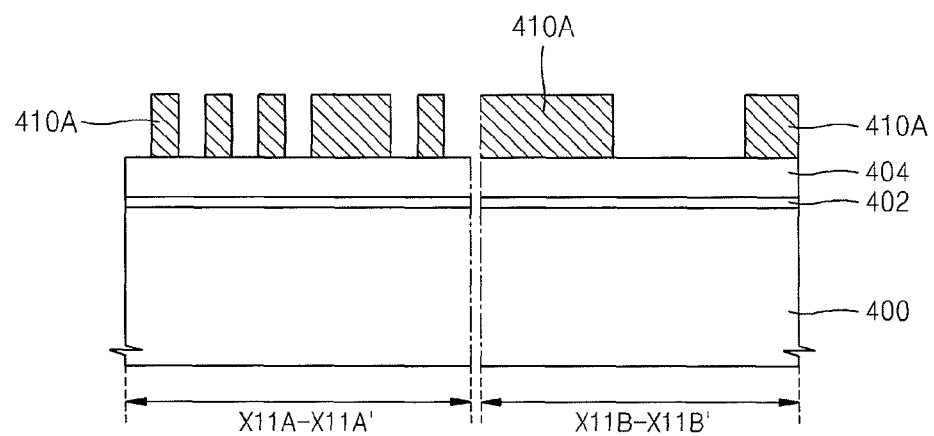

Referring to FIGS. 15A and 15B, the buffer mask layer 410 is etched using the plurality of spacers 340 and the blocking pattern 420B as an etch mask in the first region A and using the low-density large-width pattern 420C as an etch mask in the second region B, thereby forming a buffer mask pattern 410A. A mold layer 404 is exposed through the buffer mask pattern 410A in the first and second regions A and B.

Thereafter, the plurality of spacers 340, the blocking pattern 420B, and the low-density large-width pattern 420C used as an etch mask are removed. In some cases, the plurality of spacers 340, the blocking pattern 420B, and the low-density large-width pattern 420C used as an etch mask may not be removed, that is, may be left as they are. A subsequent etching process may be performed on a resultant structure in which the plurality of spacers 340, the blocking pattern 420B, and the low-density large-width pattern 420C are left.

Figure 16A:
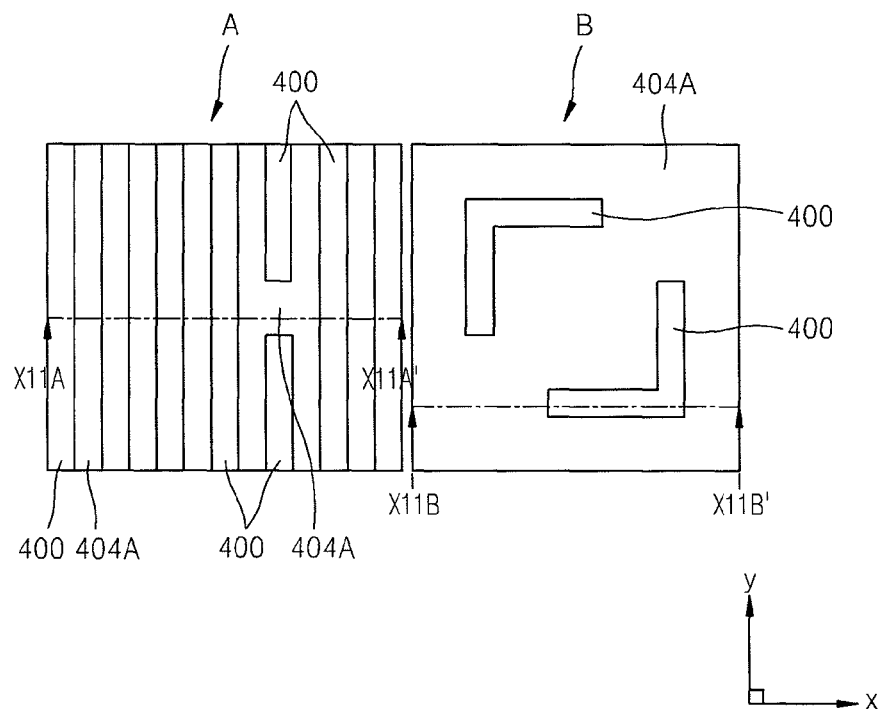
Figure 16B:
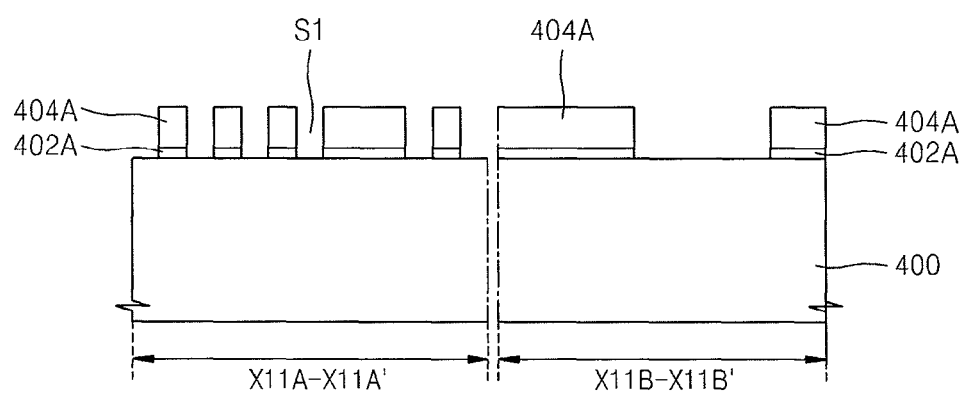

Referring to FIGS. 16A and 16B, the mold layer 404 is etched using the buffer mask pattern 410A as an etch mask in the first and second regions A and B and the etching stop layer 402 as an etching stop point, thereby forming a plurality of mold patterns 404A and a plurality of etch stop layer patterns 402A. The upper surface of the substrate 400 is exposed through spaces S1 between the mold patterns 404A.

Although not shown in FIGS. 16A and 16B, after the plurality of mold patterns 404A are formed, the plurality of buffer mask patterns 410A may remain as residual layers on the plurality of mold patterns 404A.

Figure 17A:
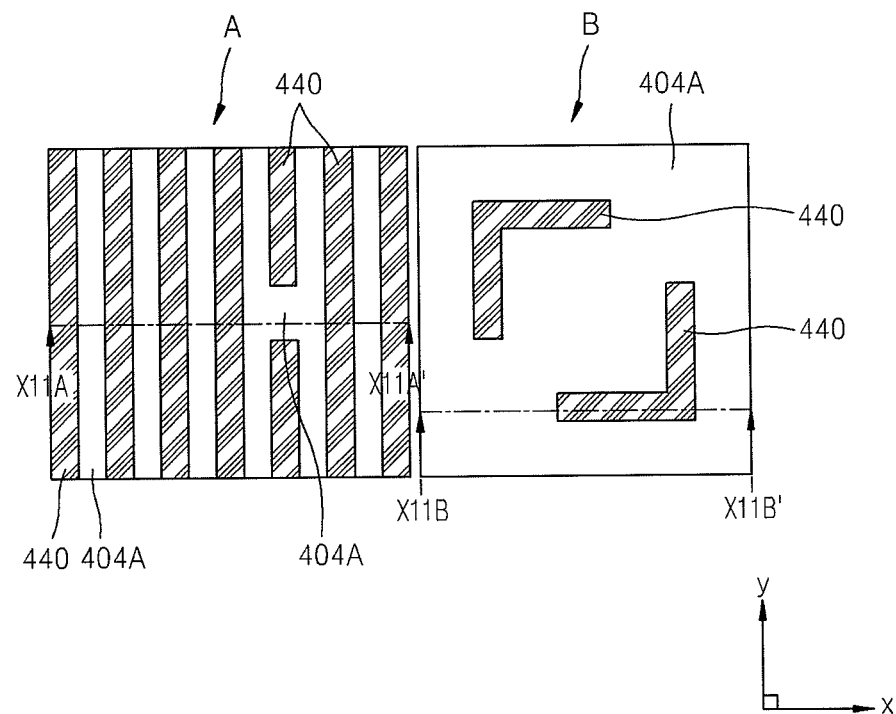
Figure 17B:
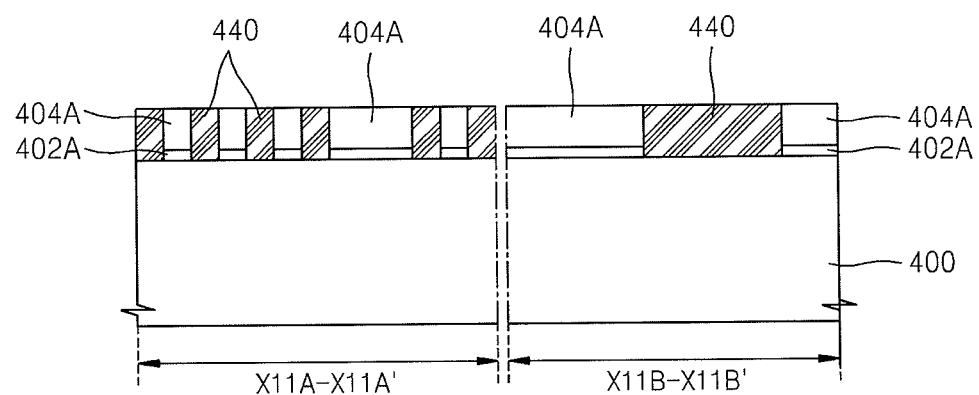

Referring to FIGS. 17A and 17B, a conductive layer is formed in the first and second regions A and B by filling the spaces S1 between the mold patterns 404A according to a damascene process, thereby forming a plurality of metallization lines 440 on the substrate 400.

A method of forming the plurality of metallization lines 440 according to the damascene process will now be described in greater detail. First, a barrier film (not shown) is formed on inside walls of the spaces S1 and the surfaces of the mold patterns 404A. Then, a metal film (not shown) with which the spaces S1 are to be completely filled is formed on the barrier film. The barrier film prevents metal atoms of the metal film from being spread to other films around the metal film. The formation of the barrier film is optional. The metal film may be formed of a metal selected from the group consisting of Cu, W, and Al, more preferably, formed of Cu because Cu has relatively small resistivity. The metal film may be formed by physical vapor deposition (PVD) or electroplating. Thereafter, a portion of the metal film and a portion of the barrier film are removed until the upper surfaces of the mold patterns 404A are exposed, thereby forming the plurality of metallization lines 440 including the barrier film and the metal film within the spaces S1 between the mold patterns 404A.

Figure 18A:
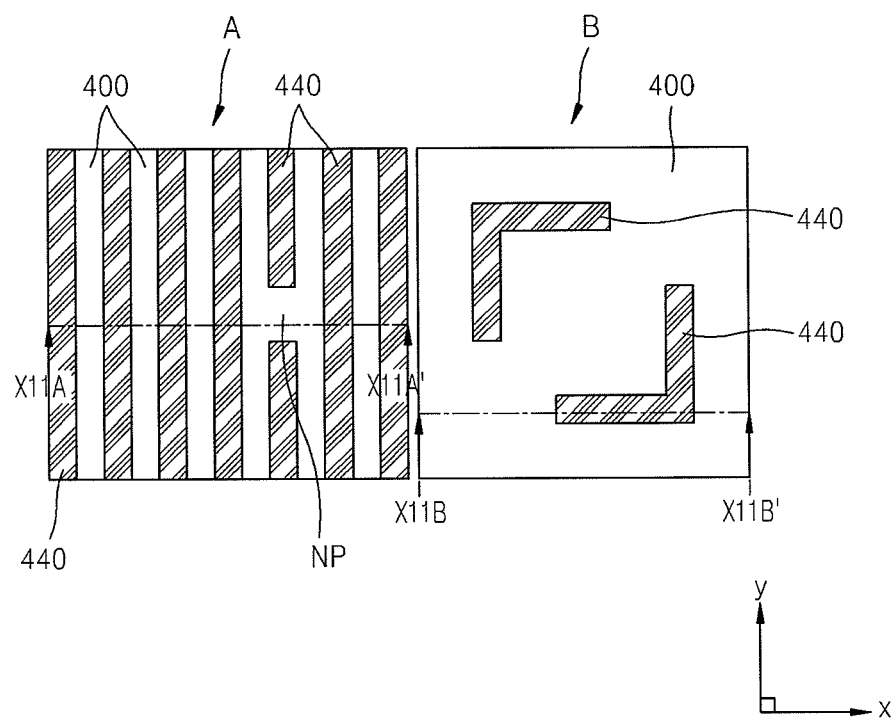
Figure 18B:
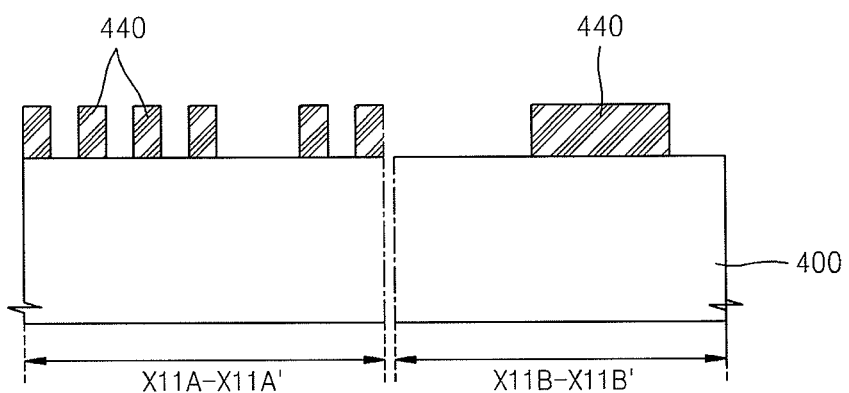

Referring to FIGS. 18A and 18B, the plurality of mold patterns 404A and the plurality of etch stop layer patterns 402A are removed. In some cases, the process of FIGS. 18A and 18B may be omitted.

In the semiconductor device pattern forming method according to the embodiment illustrated in FIGS. 11A through 18B, a plurality of metallization lines 440 are spaced apart from each other in direction y by having a separation region NP on the substrate 400, where the blocking pattern 420B was formed, in the first region A. Thus, the metallization lines 440 are node-separated from each other in direction y by the separation region NP.

Figure 19A:
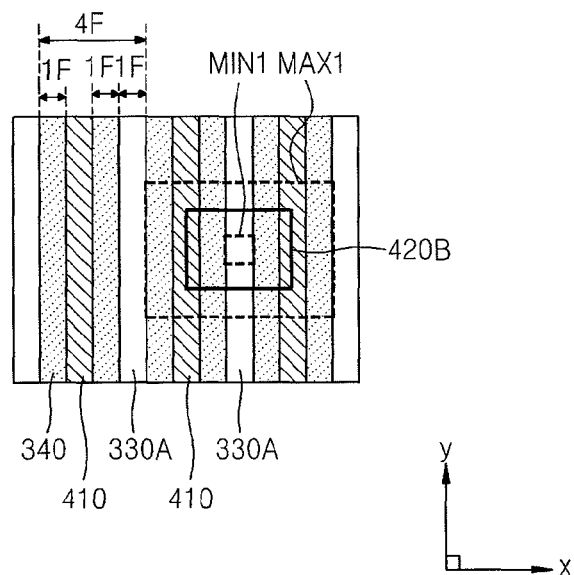
FIGS. 19A and 19B are plan views illustrating an alignment margin between patterns in the semiconductor device pattern forming method according to the embodiment illustrated in FIG. 11A through FIG. 18B.
Figure 19B:
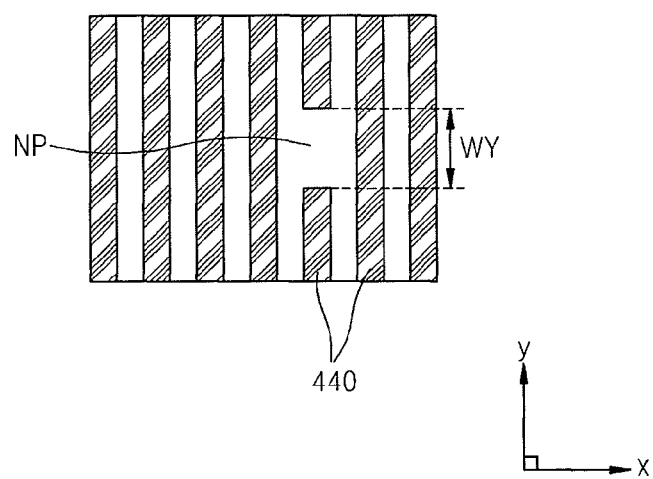

FIGS. 19A and 19B are plan views illustrating an alignment margin of the blocking pattern 420B formed in the first region A in the semiconductor device pattern forming method according to the embodiment illustrated in FIG. 11A through FIG. 18B. FIG. 19A illustrates the resultant structure of FIGS. 13A and 13B overlapped by an outline of the blocking pattern 420B formed according to the process described above with reference to FIGS. 11A and 11B. FIG. 19B is a plan view of the plurality of metallization lines 440 obtained by performing the process described above with reference to FIGS. 11A through 18B according to the design of FIG. 19A.

In FIGS. 19A and 19B, the plurality of sacrificial mask patterns 330A are line patterns each having a width of 1 F in direction x and extending parallel to each other in direction y and are repeatedly formed at a pitch of 4 F in direction x, and the spacers 340 are formed on sidewalls of the plurality of sacrificial mask patterns 330A so as to each have a width of 1 F in direction x. If the width of the blocking pattern 420B in direction x is only selected from the range of a width of 1 F indicated by a dotted box "MIN1" to a width of 7 F indicated by a dotted box "MAX1", the plurality of metallization lines 440 having the same configuration as that illustrated in FIG. 19B can be obtained. An alignment margin of 1.5 F may be secured between the blocking pattern 420B and the plurality of metallization lines 440.

In FIG. 19B, a width WY in direction y of the separation region NP corresponds to a width in direction y of the blocking pattern 420B.

Figure 20A:
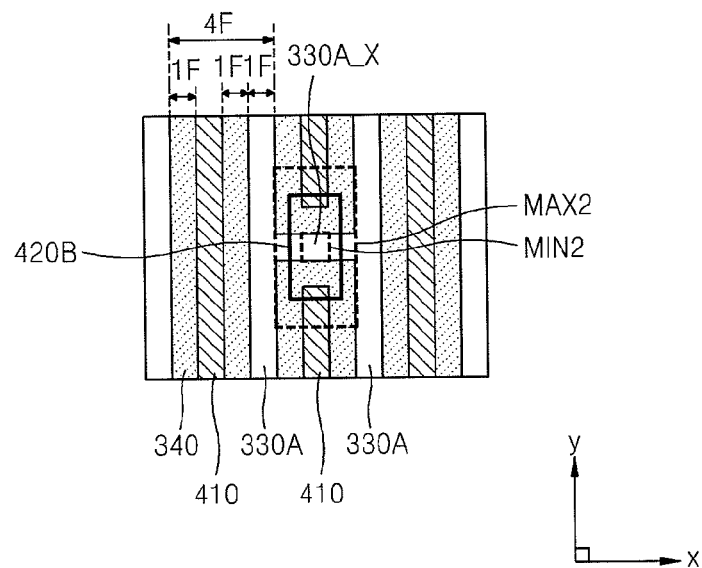
FIGS. 20A and 20B are plan views illustrating a method of forming patterns for a semiconductor device, according to another embodiment of the inventive concept.
Figure 20B:
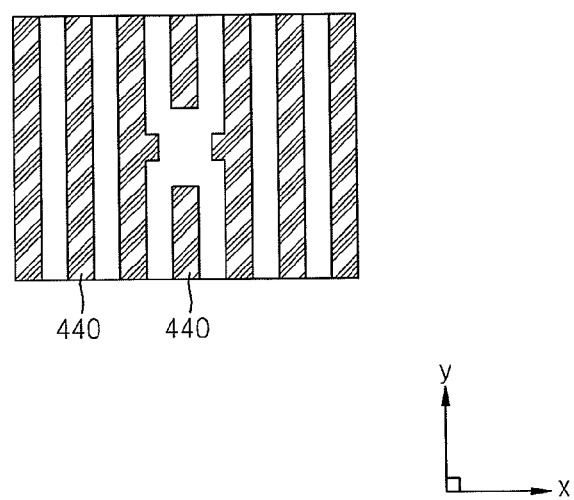

FIGS. 20A and 20B are plan views of a modified design of a semiconductor device that can be used in a method of forming patterns for a semiconductor device, according to another embodiment of the inventive concept. Same reference numerals as those in FIGS. 11A through 18B denote same elements, and thus their description will not be repeated.

Similar to FIG. 19A, FIG. 20A illustrates the resultant structure of FIGS. 13A and 13B overlapped by an outline of the blocking pattern 420B. However, the plurality of sacrificial mask patterns 330A, the plurality of spacers 340, and the blocking pattern 420B are designed to have a layout different from that of FIG. 19A. FIG. 20B is a plan view of a plurality of metallization lines 440 obtained by performing the process described above with reference to FIGS. 11A through 18B according to the design of FIG. 20A.

In FIGS. 20A and 20B, the plurality of sacrificial mask patterns 330A are line patterns each having a width of 1 F in direction x and extending parallel to each other in direction y and are repeatedly formed at a pitch of 4 F in direction x, and the spacers 340 are formed on sidewalls of the plurality of sacrificial mask patterns 330A so as to each have a width of 1 F in direction x. In addition, two adjacent sacrificial mask patterns 330A from among the plurality of sacrificial mask patterns 330A are designed so as to be connected to each other via a sacrificial mask pattern 330A_X extending in direction x.

To obtain the plurality of metallization lines 440 having a configuration the same as or similar to that illustrated in FIG. 20B, the width of the blocking pattern 420B in direction x may be selected from the range of a width of 1 F indicated by a dotted box "MIN2" to a width of 3 F indicated by a dotted box "MAX2". Accordingly, an alignment margin of 1.5 F may be secured between the blocking pattern 420B and the plurality of sacrificial mask patterns 330A.

Figure 21A:
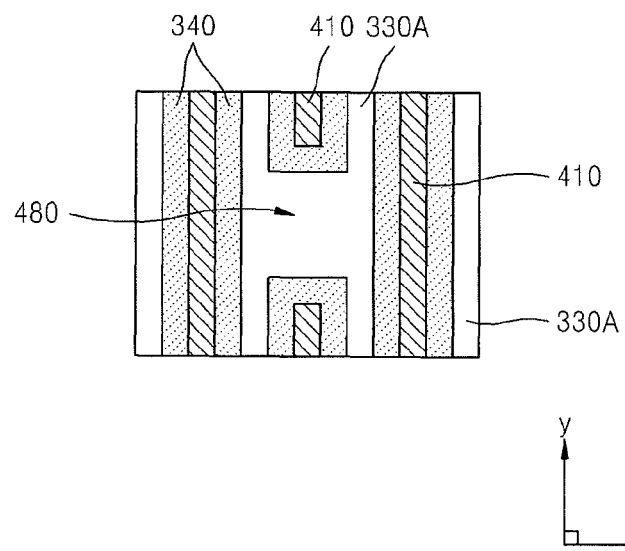
FIGS. 21A and 21B are plan views illustrating a method of forming patterns for a semiconductor device, according to another embodiment of the inventive concept.
Figure 21B:
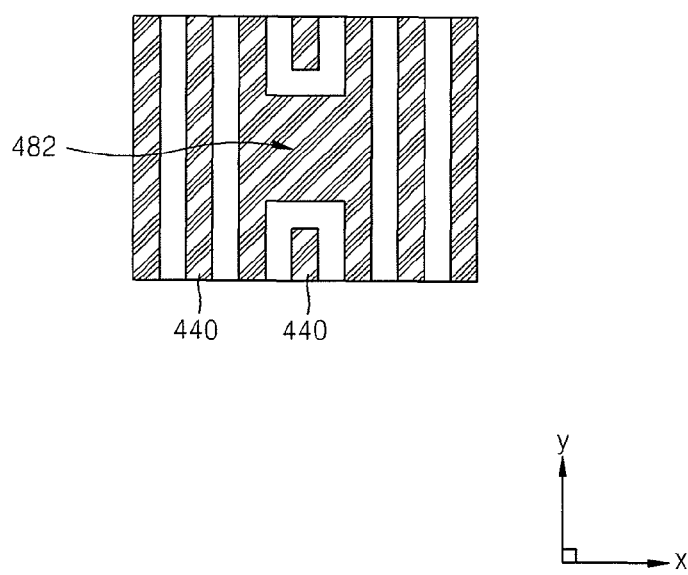

FIGS. 21A and 21B are plan views of a modified design of a semiconductor device that can be used in a method of forming patterns for a semiconductor device, according to another embodiment of the inventive concept. Same reference numerals as those in FIGS. 11A through 18B denote same elements, and thus their description will not be repeated.

FIG. 21A illustrates a layout of the plurality of sacrificial mask patterns 330A and the plurality of spacers 340 that is designed to be different from the layouts of FIGS. 19A and 20A. FIG. 21B is a plan view of the plurality of metallization lines 440 obtained by performing the process described above with reference to FIGS. 11A through 18B according to the design of FIG. 21A. However, in the embodiment of FIGS. 21A and 21B, the low-density large-width pattern 420C is formed as described above with reference to FIGS. 11A and 11B in the second region B, but the plurality of sacrificial mask patterns 330A are formed immediately on the buffer mask layer 410 without forming the blocking pattern 420B in the first region A.

By performing a process as described above with reference to FIGS. 11A through 18B according to the design of FIG. 21A, a contact pad 482 that connects some of the plurality of metallization lines 440 to each other as illustrated in FIG. 21B may be formed at a location where a large width portion 480 of the sacrificial mask patterns 330A was formed.

Figure 22A:
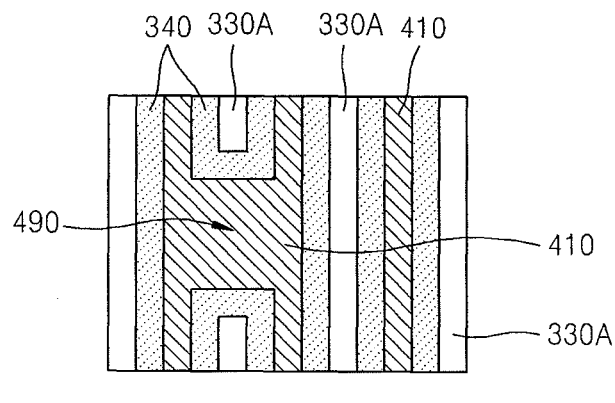
FIGS. 22A and 22B are plan views illustrating a method of forming patterns for a semiconductor device, according to another embodiment of the inventive concept.
Figure 22B:
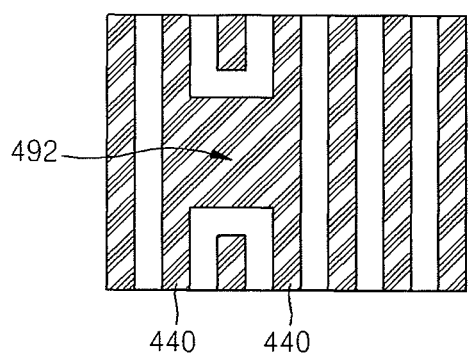

FIGS. 22A and 22B are plan views of a modified design of a semiconductor device that can be used in a method of forming patterns for a semiconductor device, according to another embodiment of the inventive concept. Same reference numerals as those in FIGS. 11A through 18B denote same elements, and thus their description will not be repeated.

FIG. 22A illustrates a layout of the plurality of sacrificial mask patterns 330A and the plurality of spacers 340 that is designed to be different from the layouts of FIGS. 19A, 20A, and 21A. FIG. 22B is a plan view of the plurality of metallization lines 440 obtained by performing the process described above with reference to FIGS. 11A through 18B according to the design of FIG. 22A. However, in the embodiment of FIGS. 22A and 22B, the low-density large-width pattern 420C is formed as described above with reference to FIGS. 11A and 11B in the second region B, but the plurality of sacrificial mask patterns 330A are formed immediately on the buffer mask layer 410 without forming the blocking pattern 420B in the first region A.

By performing a process as described above with reference to FIGS. 11A through 18B according to the design of FIG. 22A, a contact pad 492 that connects some of the plurality of metallization lines 440 to each other as illustrated in FIG. 22B may be formed at the location of a non-pattern portion 490 having a relatively large width in which the sacrificial mask patterns 330A were not formed.

While the inventive concept has been particularly shown and described with reference to exemplary embodiments thereof, it will be understood that various changes in form and details may be made therein without departing from the spirit and scope of the inventive concept, which is defined by the following claims.

What is claimed is:

1. A semiconductor device comprising:
a plurality of bit lines disposed on a substrate, the plurality of bit lines extending parallel to each other in a first direction and being spaced apart from each other in a second direction perpendicular to the first direction; and
a first pair of node-separated bit lines interposed between two neighboring bit lines selected from the plurality of bit lines, the first pair of node-separated bit lines being lined up in the first direction and being spaced apart from each other in the first direction with a separation region on the substrate therebetween.

2. The semiconductor device of claim 1, wherein the first pair of node-separated bit lines have different lengths from each other in the first direction.

3. The semiconductor device of claim 1, wherein the two neighboring bit lines are spaced apart from each other in the second direction by the separation region.

4. The semiconductor device of claim 1, wherein the first pair of node-separated bit lines and the separation region are interposed between the two neighboring bit lines.

5. The semiconductor device of claim 1, wherein the plurality of bit lines and the first pair of node-separated bit lines are arranged at equal intervals in the second direction in a metallization region surrounding the separation region on the substrate.

6. The semiconductor device of claim 1, wherein at least one bit line of the two neighboring bit lines has a protruding portion extending from a sidewall of the at least one bit line toward the separation region.

7. The semiconductor device of claim 1, further comprising a contact pad formed on the separation region and integrally connected to the two neighboring bit lines,
wherein each of the first pair of node-separated bit lines is spaced apart from the contact pad.

8. The semiconductor device of claim 1, further comprising:
a second pair of node-separated bit lines interposed between the two neighboring bit lines, the second pair of node-separated bit lines being lined up in the first direction and being spaced apart from each other in the first direction with the separation region therebetween.

9. The semiconductor device of claim 8, wherein the first pair of node-separated bit lines are spaced apart from each other in the first direction by a first distance, and the second pair of node-separated bit lines are spaced apart from each other in the first direction by a second distance, the second distance being different from the first distance.

10. The semiconductor device of claim 8, wherein the first pair of node-separated bit lines have different lengths from each other in the first direction,
wherein the second pair of node-separated bit lines have different lengths from each other in the first direction, and
wherein the length of the first pair of node-separated bit lines is different from the length of the second pair of node-separated bit lines in the first direction.

11. A semiconductor device comprising:
a plurality of bit lines extending parallel to each other in a first direction on a substrate, the plurality of bit lines including a first group of bit lines space apart from each other in a second direction perpendicular to the first direction by a first distance, and a second group of bit lines space apart from each other in the second direction by the first distance; and
at least one pair of node-separated bit lines extending in the first direction between the first group of bit lines and the second group of bit lines, the at least one pair of node-separated bit lines having a first node-separated bit line and a second node-separated bit line lined up in the first direction and being spaced apart from each other in the first direction with a separation region on the substrate therebetween,
wherein the first node-separated bit line and the second node-separated bit line have different lengths from each other in the first direction.

12. The semiconductor device of claim 11, wherein at least one bit line selected from the first group of bit lines and the second group of bit lines has a protruding portion extending from a sidewall of the selected bit line toward the separation region.

13. The semiconductor device of claim 11, wherein the first group of bit lines includes a first bit line having a first protruding portion extending from a sidewall of the first bit line toward the separation region, and
wherein the second group of bit lines includes a second bit line having a second protruding portion extending from a sidewall of the second bit line toward the separation region.

14. The semiconductor device of claim 13, wherein the first protruding portion and the second protruding portion are face to face with each other.

15. The semiconductor device of claim 11, further comprising a contact pad formed on the separation region and integrally connected to a first bit line selected from the first group of bit lines and to a second bit line selected from the second group of bit lines,
wherein each node-separated bit line of the at least one pair of node-separated bit lines is spaced apart from the contact pad.

16. The new semiconductor device of claim 1, wherein an island type active region is formed in the separation region.

17. The semiconductor device of claim 16, wherein the island type active region includes a potential control well.

18. The semiconductor device of claim 17, wherein the potential control well is configured to control the potential of a well on which a plurality of cell strings are formed.

19. The semiconductor device of claim 18, further comprising a contact formed on the potential control well.

* * * * *